(12) United States Patent
Huang et al.

(10) Patent No.: US 12,342,614 B2
(45) Date of Patent: Jun. 24, 2025

(54) ASYMMETRIC GATE STRUCTURES AND CONTACTS FOR STACKED TRANSISTORS

(71) Applicant: Intel Corporation, Santa Clara, CA (US)

(72) Inventors: Cheng-Ying Huang, Hillsboro, OR (US); Patrick Morrow, Portland, OR (US); Arunshankar Venkataraman, Mountain View, CA (US); Sean T. Ma, Portland, OR (US); Willy Rachmady, Beaverton, OR (US); Nicole K. Thomas, Portland, OR (US); Marko Radosavljevic, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 687 days.

(21) Appl. No.: 17/543,049

(22) Filed: Dec. 6, 2021

(65) Prior Publication Data

US 2023/0178552 A1    Jun. 8, 2023

(51) Int. Cl.
*H01L 27/092* (2006.01)
*H01L 21/02* (2006.01)
(Continued)

(52) U.S. Cl.
CPC ....... *H10D 84/856* (2025.01); *H01L 21/0259* (2013.01); *H01L 23/535* (2013.01);
(Continued)

(58) Field of Classification Search
CPC ............... H10D 84/856; H10D 30/031; H10D 30/6735; H10D 30/6757; H10D 62/118;
(Continued)

(56) References Cited

U.S. PATENT DOCUMENTS

2009/0283915 A1    11/2009    Becker
2018/0040695 A1     2/2018    Smith et al.
(Continued)

OTHER PUBLICATIONS

Extended European Search Report received for EP Application No. 22204391.1 dated Jul. 21, 2023. 19 pages.
(Continued)

*Primary Examiner* — Tong-Ho Kim
(74) *Attorney, Agent, or Firm* — Finch & Maloney PLLC

(57) ABSTRACT

Techniques are provided herein to form semiconductor devices having a stacked transistor configuration. An n-channel device and a p-channel device may both be gate-all-around (GAA) transistors each having any number of nanoribbons extending in the same direction where one device is located vertically above the other device. According to some embodiments, the n-channel device and the p-channel device conductively share the same gate, and a width of the gate structure around one device is greater than the width of the gate structure around the other device. According to some other embodiments, the n-channel device and the p-channel device each have a separate gate structure that is isolated from the other using a dielectric layer between them. A gate contact is adjacent to the upper device and contacts the gate structure of the other lower device.

20 Claims, 24 Drawing Sheets

(51) Int. Cl.
*H01L 21/8238* (2006.01)
*H01L 23/535* (2006.01)
*H01L 29/06* (2006.01)
*H01L 29/423* (2006.01)
*H01L 29/786* (2006.01)
*H10D 30/01* (2025.01)
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC ....... *H10D 30/031* (2025.01); *H10D 30/6735* (2025.01); *H10D 30/6757* (2025.01); *H10D 62/118* (2025.01); *H10D 84/0167* (2025.01); *H10D 84/0179* (2025.01); *H10D 84/0186* (2025.01); *H10D 84/038* (2025.01)

(58) Field of Classification Search
CPC ........... H10D 84/0167; H10D 84/0179; H10D 84/0186; H10D 84/038; H10D 30/014; H10D 30/43; H10D 64/017; H10D 62/121; H10D 64/518; H10D 84/0142; H10D 84/0149; H10D 84/83; H10D 88/01; H10D 84/85; H10D 88/00; H01L 21/0259; H01L 23/535; B82Y 10/00

USPC ........................................................ 257/351
See application file for complete search history.

(56) References Cited

U.S. PATENT DOCUMENTS

2019/0172828 A1* 6/2019 Smith .................... H10D 88/00
2019/0393214 A1* 12/2019 Lilak ...................... H10D 88/00
2020/0105751 A1* 4/2020 Dewey ................ H10D 62/235
2022/0122892 A1 4/2022 Smith et al.

OTHER PUBLICATIONS

Partial European Search Report received for EP Application No. 22204391.1 dated Apr. 5, 2023. 19 pages.

Cheng, et al., "A Routability-Driven Complimentary-FET (CFET) Standard Cell Synthesis Framework using SMT," 2020 IEEE/ACM International Conference on Computer Aided Design (ICCAD), Association on Computer Machinery, (Nov. 2, 2020). 8 pages.

Vincent, et al., "A Benchmark Study of Complementary-Field Effect Transistor (CFET) Process Integration Options Done by Virtual Fabrication," Journal of the Electron Devices Society, IEEE, vol. 8, (Apr. 28, 2020), pp. 668-673.

* cited by examiner

ASYMMETRIC GATE STRUCTURES AND CONTACTS FOR STACKED TRANSISTORS

FIELD OF THE DISCLOSURE

The present disclosure relates to integrated circuits, and more particularly, to gate structures and contacts for stacked transistor devices.

BACKGROUND

As integrated circuits continue to scale downward in size, a number of challenges arise. For instance, reducing the size of memory and logic cells, or otherwise increasing transistor device density, is becoming increasingly more difficult. One possible solution is to stack transistor devices in a vertical direction to maximize the usage of the die footprint. Stacking transistor devices presents several non-trivial challenges with regards to routing signals to each of the stacked devices.

Figure 1A:
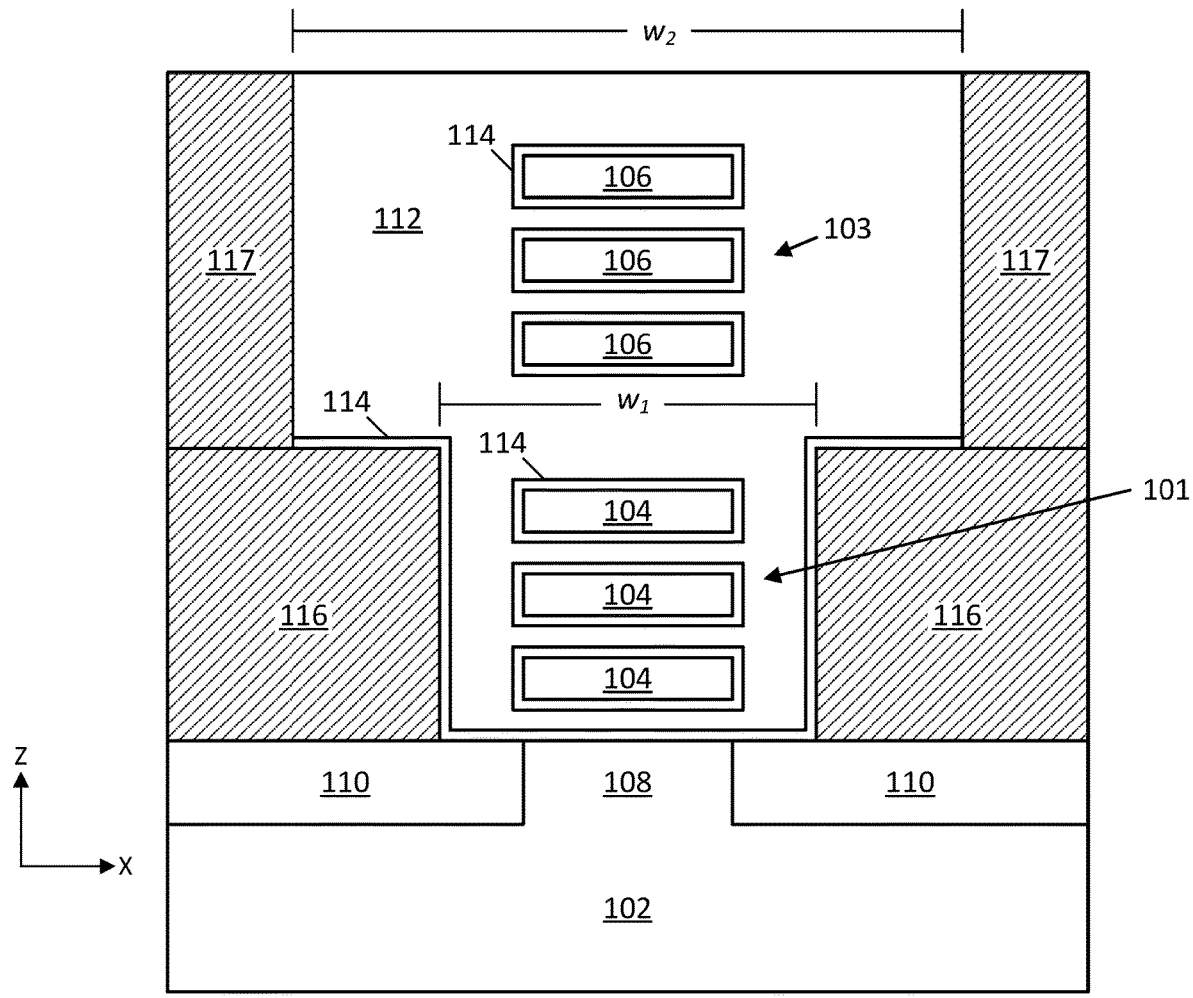
FIG. 1A is a cross-sectional view of an example integrated circuit having stacked semiconductor devices with a shared gate structure that is T-shaped, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having a stacked transistor configuration (e.g., devices stacked in a vertical z-direction from the substrate surface). The techniques can be used in any number of integrated circuit applications and are particularly useful with respect to logic and memory cells as well as CMOS cells, such as those cells that use gate-all-around (GAA) transistors. In one example, two different semiconductor devices of a given cell include a p-channel device and an n-channel device. More specifically, the n-channel device and the p-channel device may both be GAA transistors each having any number of nanoribbons extending in the same direction where the n-channel device is located vertically above the p-channel device (or vice versa). According to some embodiments, the n-channel device and the p-channel device conductively share the same gate structure, and a width of the gate structure around one device is greater than (e.g., at least 5 nanometers greater than) the width of the gate structure around the other device, thus creating an asymmetric gate profile (e.g., T-shaped, inverse T-shaped, V-shaped, or inverse V-shaped) across both devices. In other shared gate structure configurations, one gate structure may extend laterally far enough that it also acts as a gate for an adjacent semiconductor device. According to some other embodiments, the n-channel device and the p-channel device each have a separate gate structure that is isolated from the other using a dielectric layer between them. In some such cases, the two isolated gate structures are aligned on one side, with one gate being wider than the other gate, and a gate contact extends along one side of one narrower gate structure to land on the wider gate structure. In some such cases, the gate contact has a length greater than the length of the gate structure on which it lands. Numerous variations and embodiments will be apparent in light of this disclosure.

General Overview

As previously noted above, there remain a number of non-trivial challenges with respect to designing stacked semiconductor devices. One way to increase transistor density is to stack transistor devices over one another in the vertical direction from the surface of the substrate. In the case of nanoribbon or nanosheet devices, such as GAA transistors or forksheet transistors, some additional vertical distance is provided between devices to provide sufficient isolation. However, the distance between the stacked devices can cause problems with signal routing to the lower device (or the upper device in the case of backside contacts). For example, a frontside interconnect made to the gate structure of the top device has a larger resistance to access the gate structure of the bottom device in a shared gate arrangement (or vice versa in the case of a backside interconnect). The higher resistance causes a greater IR voltage drop when accessing the lower device (or top device for a backside interconnect), thus leading to an imbalanced response between the stacked devices. A similar imbalanced response problem occurs when using a split gate architecture (e.g., top and bottom gates are isolated from one another) where a large IR voltage drop occurs across a contact used to provide signal or power to the lower gate (or upper gate for a backside contact).

Thus, and in accordance with some embodiments of the present disclosure, techniques are provided herein to form stacked transistors (such as a first device over a second device) having an asymmetric gate structure (for a shared gate) or an elongated contact (for a split gate). An asymmetric gate structure is used to describe a first gate structure having a first width and a second gate structure directly on the first gate structure and having a second width where the second width is greater than the first width (e.g., second width is at least 5 nm greater than the first width); alternatively, the gate structure having the greater second width is below the narrower gate structure if the structure were inverted or used in conjunction with a backside interconnect. Similarly, the term 'elongated contact' is used to describe a contact having a lateral (horizontal) length that is longer than the underlying gate surface on which it lands. Such a shared gate or contact configuration may form coupled gates or contacts having a 'T' shape or an inverted 'T' shape.

In some embodiments, effects of the fabrication process may cause a shared gate 'T' shape or inverted 'T' shape to look more like a 'V' shape or an inverted 'V' shape. Similarly, the elongated gate contact may have sloped or tapered sidewalls to form a 'V' shape or an inverted 'V' shape. In such sloped or tapered configurations, note that an average or otherwise statistically representative width along a given taper can be determined, for purposes of comparing an upper width (e.g., having a first average width) to a lower width (e.g., having a second average width). In some embodiments, the wider gate in the shared gate configuration may extend far enough such that it also acts as a gate for an adjacent semiconductor device.

In general, description herein of an asymmetric gate or an elongated contact provides examples of such structures, but similar geometries that yield a similar result will also be appreciated. Although description herein focuses on the use of GAA transistor configurations, the techniques can be applied to other channel configurations as well, such as forksheet transistors.

The asymmetric gate allows for a decrease in the voltage drop across the wider gate portion due to the larger area of the gate since resistance scales based on gate thickness/area. Accordingly, a signal passing through a larger surface area will experience less resistance, thus lowering the voltage drop. A similar situation occurs for a gate contact, where a longer gate contact lowers the voltage drop of a signal traveling through the contact to an underlying or overlying gate structure. Numerous variations and embodiments will be apparent in light of this disclosure.

According to an embodiment, an integrated circuit includes a first semiconductor device having first one or more semiconductor nanoribbons (or other semiconductor bodies, such as nanowires or nanosheets) extending in a first direction between a first source region and a first drain region, and a second semiconductor device having second one or more semiconductor nanoribbons (or other semiconductor bodies, such as nanowires or nanosheets) extending in the first direction between a second source region and a second drain region. The first one or more semiconductor nanoribbons are spaced vertically from the second one or more semiconductor nanoribbons in a second direction different from the first direction. The integrated circuit also includes a first gate structure around the first one or more semiconductor nanoribbons that includes a first width in a third direction different from the first and second directions between a first gate plug and a second gate plug, and a second gate structure around the second one or more semiconductor nanoribbons that includes a second width in the third direction between a third gate plug and a fourth gate plug. The first width is at least 5 nanometers greater than the second width and the second gate structure directly contacts the first gate structure in a same gate trench. In general, a gate plug is a body of dielectric material that plugs up or otherwise fills a portion of the overall gate trench and are effectively used to shape the asymmetric nature of the gates. In particular, different layers of gate plugs are used to create different gate widths for the top and bottom gates.

According to another embodiment, an integrated circuit includes a first semiconductor device having first one or more semiconductor nanoribbons (or other semiconductor bodies, such as nanowires or nanosheets) extending in a first direction between a first source region and a first drain region, and a second semiconductor device having second one or more semiconductor nanoribbons (or other semiconductor bodies, such as nanowires or nanosheets) extending in the first direction between a second source region and a second drain region. The first one or more semiconductor nanoribbons are spaced vertically from the second one or more semiconductor nanoribbons in a second direction different from the first direction. The integrated circuit also includes a first gate structure around the first one or more semiconductor nanoribbons that includes a first width in a third direction different from the first and second directions between a first gate plug and a second gate plug, a dielectric layer over the first gate structure, and a second gate structure over the dielectric spacer and around the second one or more semiconductor nanoribbons. The second gate structure has a second width different from the first width in the third direction between a third gate plug and a fourth gate plug. The integrated circuit also includes a gate contact extending through the fourth gate plug and contacting a portion of the first gate structure. The gate contact has a length in the first direction and that length is greater than the surface of the portion of the first gate structure on which it lands, such that the contact extends past each side of that portion. As explained above and further detailed below, a gate plug is a body of dielectric material used to create different gate widths for the top and bottom gates.

According to another embodiment, a method for forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel, the multilayer fin extending lengthwise in a first direction; removing the first material layers and the third layers to form suspended first one or more nanoribbons from the second material layers and suspended second one or more nanoribbons from the fourth material layers; forming a first mask material around the first one or more nanoribbons and the second one or more nanoribbons; forming a first gate plug adjacent to the first mask material, wherein a top surface of the gate plug is above a topmost nanoribbon of the first one or more nanoribbons and below a bottommost nanoribbon of the second one or more nanoribbons; removing the first mask material and forming a first gate structure around the first one or more nanoribbons; forming a second mask material around the second one or more nanoribbons; forming a second gate plug adjacent to the second mask material, the second gate plug being over the first gate plug; and removing the second mask material and forming a second gate structure around the second one or more nanoribbons, wherein the second gate structure has a greater width in a second direction orthogonal to the first direction compared to a width of the first gate structure in the second direction.

According to another embodiment, a method for forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel, the multilayer fin extending lengthwise in a first direction; removing the first material layers and the third layers to form suspended first one or more nanoribbons from the second material layers and suspended second one or more nanoribbons from the fourth material layers; forming a first mask material around the first one or more nanoribbons and the second one or more nanoribbons; forming a first gate plug adjacent to the first mask material, wherein a top surface of the gate plug is above a topmost nanoribbon of the first one or more nanoribbons and below a bottommost nanoribbon of the second one or more nanoribbons; removing the first mask material and forming a first gate structure around the first one or more nanoribbons; forming a second mask material around the second one or more nanoribbons; forming a second gate plug adjacent to the second mask material, the second gate plug being over the first gate plug; removing the second mask material and forming a dielectric layer over the first gate structure; forming a second gate structure over the dielectric layer and around the second one or more nanoribbons; etching a recess through the second gate plug, the recess exposing a portion of the first gate structure; and forming a gate contact within the recess, the gate contact conductively coupled to the first gate structure and having a length in the first direction and that length is greater than the portion of the first gate structure on which it lands.

The techniques are especially suited for use with stacked gate-all-around transistors such as nanowire and nanoribbon and nanosheet transistors. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate electrode can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate shared gate structures having a top or bottom gate that is wider than the other gate (e.g., forming a shared 'T' gate structure or a shared 'V' gate structure). In some other examples, such tools may indicate a gate contact used to contact a lower gate (or upper gate) in a split gate architecture, where the gate contact has a greater lateral length (e.g., extending in a same direction as the nanoribbons of the devices) than the lower gate surface on which it lands.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," and "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1 is a cross sectional view of a portion of an integrated circuit that includes a first semiconductor device 101 and a second semiconductor device 103 stacked vertically over first semiconductor device 101. The cross-section view is taken lengthwise across first semiconductor device 101 and second semiconductor device 103 in a first direction while the devices are vertically stacked over one another in a second direction orthogonal to the first direction. Each of semiconductor devices 101 and 103 may be gate-all-around (GAA) transistors, although other transistor topologies and types could also benefit from the techniques provided herein. The illustrated embodiments herein use the GAA structure. Semiconductor devices 101 and 103 represent a portion of the integrated circuit that may contain any number of similar semiconductor devices.

As can be seen, semiconductor devices 101 and 103 are formed over a substrate 102. Any number of semiconductor devices can be formed in a stacked configuration over substrate 102, but two are used here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

First semiconductor device 101 may include any number of semiconductor nanoribbons 104 (or other semiconductor bodies, such as nanosheets or nanowires) extending in a first direction (e.g., into and out of the page in a Y direction) between a first source region and a first drain region. Likewise, second semiconductor device 103 may include any number of semiconductor nanoribbons 106 (or other semiconductor bodies, such as nanosheets or nanowires) extending between a second source region and a second drain region. Any source region may also act as a drain region and vice versa, depending on the application. The source and drain regions for both semiconductor devices 101 and 103 are not shown in the cross-section as they are disposed into and out of the page coupled to ends of nanoribbons 104 and 106. In some embodiments, one or both of the source regions and drain regions of either semiconductor device 101 or 103 could be, for example, implantation-doped native portions of the semiconductor fins or substrate. Any semiconductor materials suitable for source and drain regions can be used (e.g., group IV and group III-V semiconductor materials). The source regions and drain regions may include multiple layers such as liners and capping layers to improve contact resistance. In any such cases, the composition and doping of the source and drain regions may be the same or different, depending on the polarity of the transistors. In an example, one semiconductor device is a p-type MOS (PMOS) transistor, and the other semiconductor device is an n-type MOS (NMOS) transistor. Any number of source and drain configurations and materials can be used.

In some embodiments, semiconductor devices 101 and 103 have an equal number of nanoribbons, while in other embodiments they have an unequal number of nanoribbons. In some embodiments, each of nanoribbons 104 and nanoribbons 106 are formed from a fin of alternating layers of material that are etch selective to each other (e.g., alternating layers of silicon and silicon germanium) where sacrificial material layers are removed between nanoribbons 104 and nanoribbons 106. Each of nanoribbons 104 and nanoribbons 106 may include the same semiconductor material as substrate 102. In some cases, nanoribbons 104 comprise silicon and nanoribbons 106 comprise silicon germanium. A vertical distance between about 15 nm and about 100 nm separates the uppermost nanoribbon of nanoribbons 104 of first semiconductor device 101 from the lowermost nanoribbon of nanoribbons 106 of second semiconductor device 103.

Semiconductor devices 101 and 103 collectively include a subfin 108, in this example case. According to some embodiments, subfin region 108 is part of, and comprises the same semiconductor material as, substrate 102 and is adjacent to a dielectric layer 110. Dielectric layer 110 may include silicon oxide and provides shallow trench isolation (STI) between any adjacent semiconductor devices. Dielectric layer 110 can be any suitable dielectric material, such as silicon dioxide, aluminum oxide, or silicon oxycarbonitride.

According to some embodiments, a shared gate electrode 112 is provided over each of nanoribbons 104 and nanoribbons 106. The shared gate electrode 112 may include any sufficiently conductive material such as a metal, metal alloy, or doped polysilicon. Shared gate electrode 112 includes two separately formed gate electrodes, such as a first gate electrode around nanoribbons 104 of first semiconductor device 101 and a second gate electrode around nanoribbons 106 of second semiconductor device 103. With no insulating layer between them, the two gate electrodes are conductively coupled together into shared gate electrode 112. This is described in more detail herein with reference to FIGS. 3A-3F. In other embodiments, shared gate electrode 112 is a continuous body of conductive material(s), a first gate electrode portion around nanoribbons 104 of first semiconductor device 101 and a second gate electrode portion around nanoribbons 106 of second semiconductor device 103.

A gate dielectric 114 is provided around each of nanoribbons 104 and 106 between the nanoribbons and shared gate electrode 112. The gate dielectric may include a single material layer or multiple material layers. In some embodiments, the gate dielectric includes a first dielectric layer such as silicon oxide and a second dielectric layer that includes a high-k material such as hafnium oxide. The hafnium oxide may be doped with an element to affect the threshold voltage of the given semiconductor device. In some embodiments, the gate dielectric around nanoribbons 104 has a different element doping concentration compared to the gate dielectric around nanoribbons 106. According to some embodiments, the doping element used in the gate dielectric is lanthanum.

Shared gate electrode 112 and gate dielectric 114 together form a shared gate structure. In some examples, a first gate structure includes the first gate electrode and gate dielectric 114 around nanoribbons 104 and a second gate structure includes the second gate electrode and gate dielectric 114 around nanoribbons 106. Each of the first and second gate electrodes may include any sufficiently conductive material such as a metal, metal alloy, or doped polysilicon. In some embodiments, the first and second gate electrode include one or more workfunction metals around corresponding nanoribbons 104 and 106. In some embodiments, semiconductor device 101 is a p-channel device that includes n-type dopants within nanoribbons 104 and includes a workfunction metal having titanium around nanoribbons 104, and semiconductor device 103 is an n-channel device that includes p-type dopants within nanoribbons 106 and includes a workfunction metal having tungsten around nanoribbons 106. The first and second gate electrodes may also each include a fill metal or other conductive material (e.g., tungsten, molybdenum, ruthenium) around the work-function metals.

As discussed above, the first gate structure around first nanoribbons 104 may have a first width $w_1$ extending, for example, in an X-direction that is less than a second width $w_2$ of the second gate structure around second nanoribbons 106. The widths of the gate structures may be determined based on a spacing between gate plugs disposed on either side of the stacked gate structures. For example, first gate plugs 116 may be formed on either side of the first gate structure around first nanoribbons 104 and second gate plugs 117 may be formed on either side of the second gate structure around second nanoribbons 106. Each of first gate plugs and second gate plugs may be the same dielectric material, such as silicon nitride, although other dielectric materials may be used as well. In some examples, first gate plugs 116 include a different dielectric material compared to second gate plugs 117. Note that in some embodiments, gate dielectric 114 forms over sidewall portions of first gate plugs 116 and on a portion of a top surface of first gate plugs 116. In some embodiments, depending on when gate dielectric 114 is formed, it may also be present on sidewall portions of second gate plugs 117.

According to some embodiments, width $w_1$ is between about 20 nm and about 50 nm and width $w_2$ is between about 50 nm and about 100 nm. In some examples, width $w_2$ is at least 5 nm greater than width $w_1$, at least 10 nm greater than width $w_1$, at least 20 nm greater than width $w_1$, at least 30 nm greater than width $w_1$, or at least 40 nm greater than width $w_1$. The wider top gate structure may be used with front side contacts to reduce the voltage drop to the lower semiconductor device 101. In other embodiments, the gate structure widths may be reversed such that the wider bottom gate structure is used with backside contacts to reduce the voltage drop to the upper semiconductor device 103.

In some embodiments, the first gate structure or the second gate structure may extend further in the X-direction to also encompass an additional set of nanowires from a third semiconductor device adjacent to either first semiconductor device 101 or second semiconductor device 103. Such a gate architecture may form a shared gate electrode 112 around the semiconductor nanoribbons of each of the first, second, and third semiconductor devices.

Figure 1B:
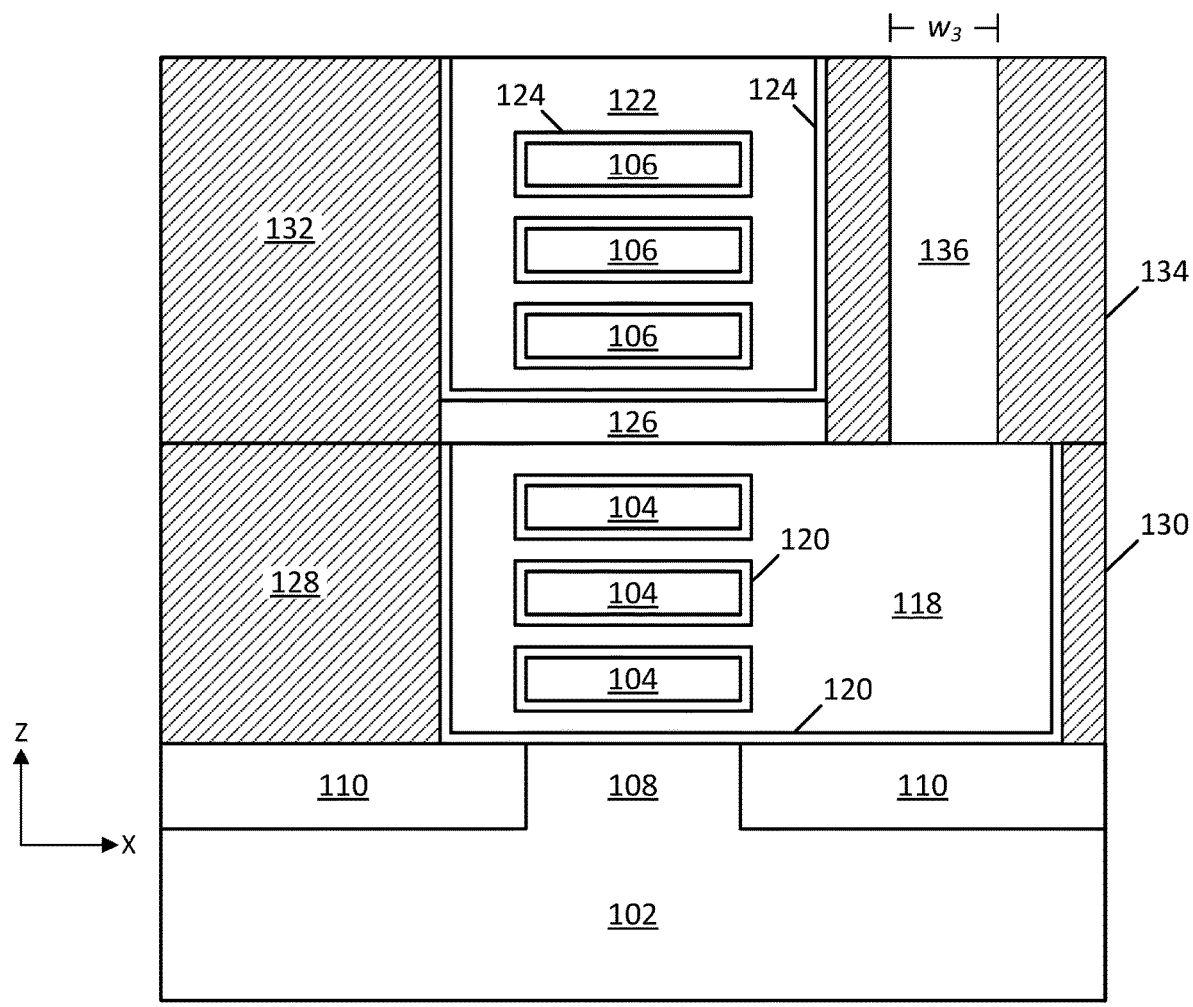
FIG. 1B is a cross-sectional view of another example integrated circuit having stacked semiconductor devices with a split gate structure and a gate contact that lands on the bottom gate of the split gat structure, in accordance with an embodiment of the present disclosure.

FIG. 1B illustrates a portion of an integrated circuit having a different gate structure architecture, according to some embodiments. The first and second semiconductor devices have a split gate design where a first gate electrode 118 and a first gate dielectric 120 are formed around first nanoribbons 104 (or other semiconductor bodies, such as nanosheets or nanowires), and a second gate electrode 122 and a second gate dielectric 124 are formed separately around second nanoribbons 106 (or other semiconductor bodies, such as nanosheets or nanowires). First gate electrode 118 and first gate dielectric 120 together form a first gate structure, and second gate electrode 122 and second gate dielectric 124 together form a second gate structure. The discussion above with regards to gate dielectric 114 also applies to each of first gate dielectric 120 and second gate dielectric 124. Additionally, the discussion above with regards to the first and second gate electrodes of shared gate electrode 112 also applies to first gate electrode 118 and second gate electrode 122.

First gate electrode 118 and second gate electrode 122 are electrically isolated from one another by a dielectric layer 126 disposed between first gate electrode 118 and second gate electrode 122. Dielectric layer 126 may be any suitable dielectric material, such as silicon dioxide, aluminum oxide, or silicon oxycarbonitride.

The first gate structure extends, for example, in the X-direction between a first gate plug 128 and a second gate plug 130. In some embodiments, the second gate structure extends in the X-direction between a third gate plug 132 and a fourth gate plug 134. Each of the gate plugs may have the same material composition. One or more of the gate plugs may include a dielectric material, such as silicon nitride. Other suitable dielectric materials may be used as well. According to some embodiments, first gate electrode 118 extends beneath at least a portion of fourth gate plug 134. In some examples, first gate electrode 118 may also extend beneath a portion of third gate plug 132. Accordingly, the first gate structure may have a greater width in the X-direction compared to the second gate structure. In some embodiments, gate dielectric layer 126 extends below one or both of third gate plug 132 and fourth gate plug 134.

Figure 1C:
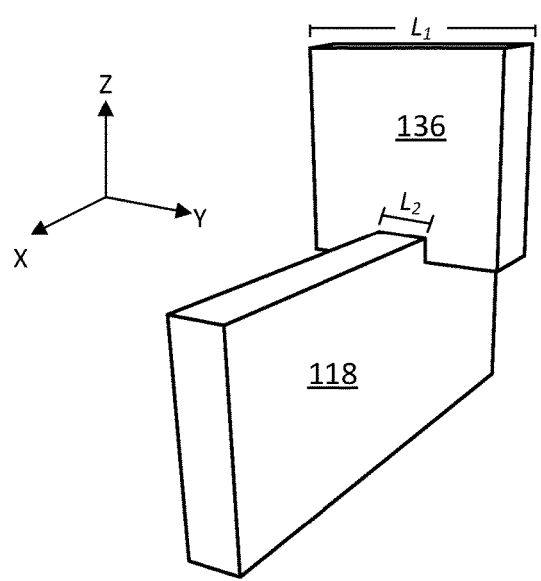
FIG. 1C is a three-dimensional perspective view of the bottom gate and gate contact of the semiconductor devices of FIG. 1B.

According to some embodiments, a gate contact 136 is formed through fourth gate plug 134 such that it contacts a portion of gate electrode 118. Gate contact 136 may be any suitably conductive material, such as any metal. In some examples, gate contact 136 includes tungsten, copper, titanium, ruthenium, cobalt, or any alloys thereof. Gate contact 136 has a width $w_3$ in the X-direction that is sufficiently small enough to ensure that gate contact 136 is within a width of fourth gate plug 134. In some embodiments, a dielectric spacer is formed between the second gate structure and gate contact 136 to provide sufficient isolation between the second gate structure and gate contact 136. According to some embodiments, gate contact 136 includes a length $L_1$ that is larger than its width $w_3$. FIG. 1C illustrates a perspective view of first gate electrode 118 and gate contact 136 over first gate electrode 118, according to some embodiments. The length $L_1$ of gate contact 136 may be at least twice as long as its width $w_3$. In some examples, gate contact 136 has a width $w_3$ between about 10 nm and about 20 nm and a length $L_1$ between about 20 nm and about 60 nm. In some embodiments, the length $L_1$ of gate contact 136 is also larger than a length $L_2$ of gate electrode 118. For example, length $L_1$ of gate contact 136 may be at least twice as long, at least three times as long, or at least four times as long as the length $L_2$ of gate electrode 118.

Fabrication Methodology

FIGS. 2A-2D include cross-sectional views that collectively illustrate an example process for forming an integrated circuit configured with stacked semiconductor devices, in accordance with an embodiment of the present disclosure. Each figure shows an example structure that results from the process flow up to that point in time, so the depicted structure evolves as the process flow continues, culminating in the structure shown in FIG. 2D. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
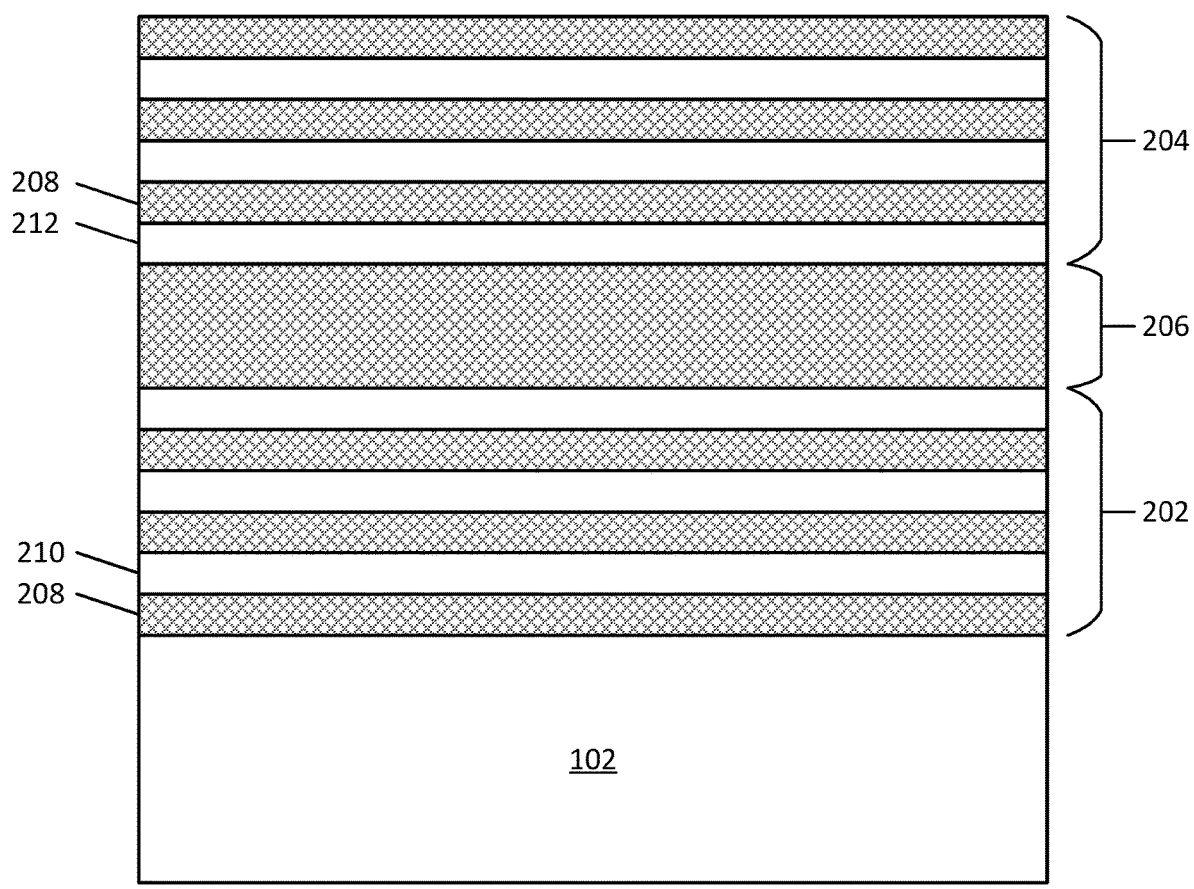
FIGS. 2A-2D are cross-sectional views that collectively illustrate an example process for forming stacked semiconductor devices, in accordance with an embodiment of the present disclosure.

FIG. 2A illustrates a cross-sectional view across a substrate having a series of material layers deposited over it, according to an embodiment of the present disclosure. The previous relevant discussion with respect to example configurations and materials for substrate 102 is equally applicable here. Alternating material layers may be deposited over substrate 102, including a first layer stack 202, a second layer stack 204, and a spacer layer 206 between first layer stack 202 and second layer stack 204. Each of first and second layer stacks 202 and 204 includes sacrificial layers 208 alternating with other material layers, such as first semiconductor layers 210 of first layer stack 202 and second semiconductor layers 212 of second layer stack 204. Any number of alternating sacrificial layers 208 and material layers may be deposited within each of first layer stack 202 and second layer stack 204.

According to some embodiments, sacrificial layers 208 have a different material composition than each of first semiconductor layers 210 and second semiconductor layers 212. In some embodiments, sacrificial layers 208 are silicon germanium (SiGe) while each of first semiconductor layers 210 and second semiconductor layers 212 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 208 and first and second semiconductor layers 210 and 212, the germanium concentration is different between sacrificial layers 208 and first and second semiconductor layers 210 and 212. For example, sacrificial layers 208 may include a higher germanium content compared to first and second semiconductor layers 210 and 212. Spacer layer 206 may include the same material as sacrificial layers 208. In some examples, spacer layer 206 can be any material that exhibits a high etch selectivity with the material of semiconductor layers 210 and 212.

While dimensions can vary from one example embodiment to the next, the thickness of each sacrificial layer 208 may be between about 5 nm and about 20 nm. In some embodiments, the thickness of each sacrificial layer 208 is substantially the same (e.g., within 1-2 nm) across each of first layer stack 202 and second layer stack 204. The thickness of each of first semiconductor layers 210 and second semiconductor layers 212 may be about the same as the thickness of each sacrificial layer 208 (e.g., about 5-20 nm). However, according to some embodiments, the thickness of spacer layer 206 is thicker than any of sacrificial layers 208. Spacer layer 206 is provided to create a sufficient spacing between the adjacent semiconductor devices to be formed from first semiconductor layers 210 and second semiconductor layers 212. While dimensions can vary from one example embodiment to the next, the thickness of spacer layer 206 may be between about 15 nm to about 100 nm. Each of sacrificial layers 208, first semiconductor layers 210, spacer layer 206, and second semiconductor layers 212 may be deposited using any known material deposition technique, such as chemical vapor deposition (CVD), plasma-enhanced chemical vapor deposition (PECVD), physical vapor deposition (PVD), or atomic layer deposition (ALD).

First semiconductor layers 210 may be doped with either n-type dopants (to produce a p-channel transistor) or p-type dopants (to produce an n-channel transistor). Similarly, second semiconductor layers 212 may be doped with either n-type dopants (to produce a p-channel transistor) or p-type dopants (to produce an n-channel transistor).

Figure 2B:
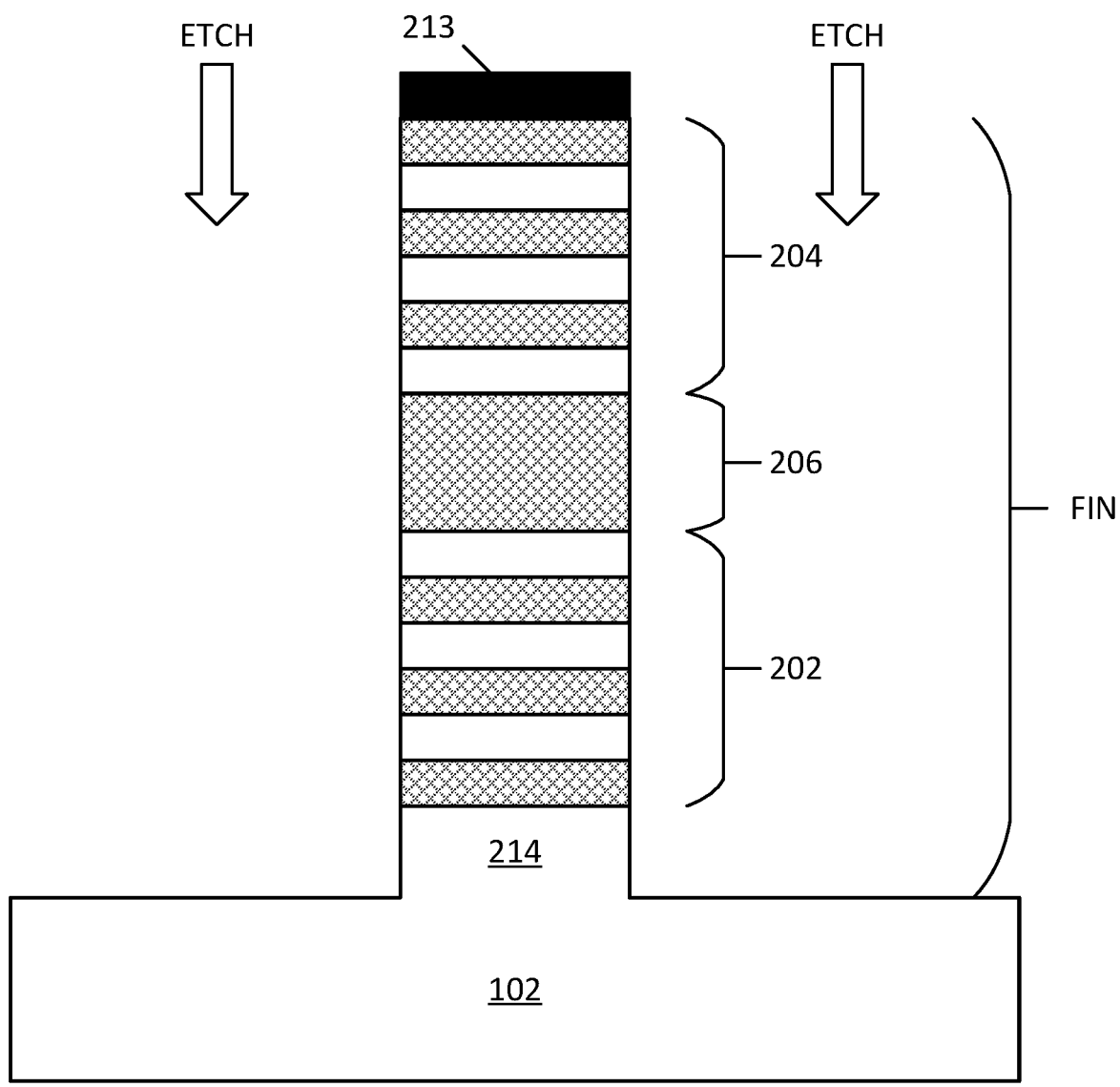

FIG. 2B illustrates a cross-sectional view of the structure shown in FIG. 2A following the formation of a fin having the alternating layer structure of first layer stack 202, second layer stack 204, and spacer layer 206, according to an embodiment. A cap layer 213 may be used to protect the underlying fin while an anisotropic etch is performed to remove the unprotected layer stack. Cap layer 213 may include a dielectric material such as silicon nitride. In other embodiments, a photoresist is used to protect the underlying fin during the anisotropic etch. The anisotropic etch may be performed using reaction ion etching (RIE) or deep reactive ion etching (DRIE).

According to some embodiments, the anisotropic etch also etches into a portion of substrate 102, thus forming subfin 214 beneath the stack of material layers in the fin. Subfins of various heights may be formed to create more or less distance between the resulting gate structures and substrate 102.

Figure 2C:
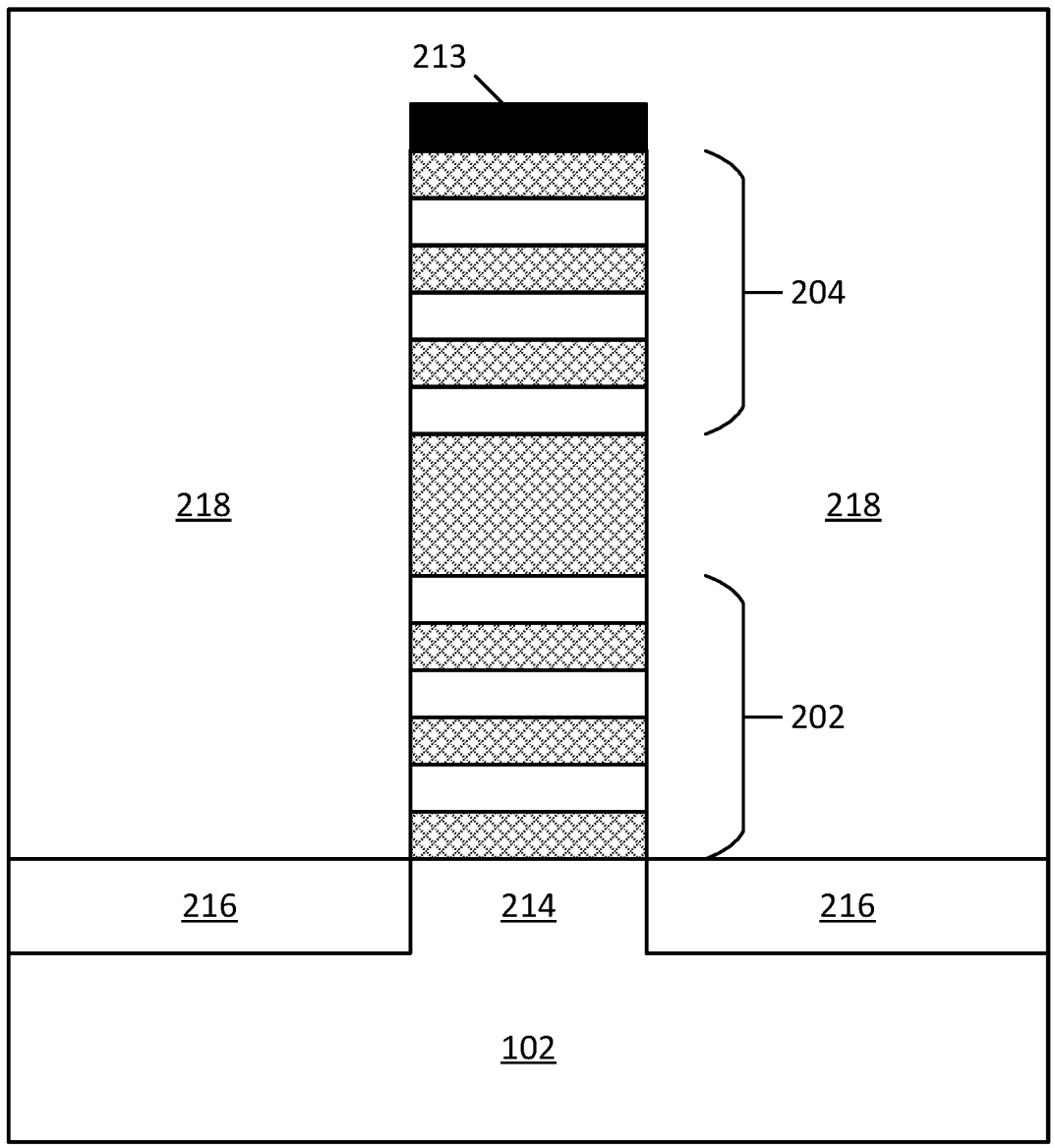

FIG. 2C illustrates a cross-sectional view of the structure shown in FIG. 2B following the formation of dielectric fill 216 and sacrificial gate 218, according to an embodiment. Dielectric fill 216 may be deposited and recessed until a top surface of dielectric fill 216 is about even with a top surface of subfin 214. Dielectric fill 216 may be any suitable dielectric material such as silicon dioxide, aluminum oxide, or silicon oxycarbonitride.

Sacrificial gate 218 may run in an orthogonal direction to the length of the fin and may include any material that can be safely removed later in the process without etching or otherwise damaging any portions of the fin. In some embodiments, sacrificial gate 218 includes polysilicon. In some embodiments, sacrificial gate 218 extends over the top surfaces of cap layer 213.

Following the formation of sacrificial gate 218, additional semiconductor device structures are formed that are not shown in these cross-sections. Briefly, spacer structures are formed on the sidewalls of sacrificial gate 218 and source and drain regions are formed on either ends of the fin. A first set of source and drain regions may be formed at either ends of the semiconductor layers within first layer stack 202 and a different second set of source and drain regions may be formed at either ends of the semiconductor layers within second layer stack 204.

Figure 2D:
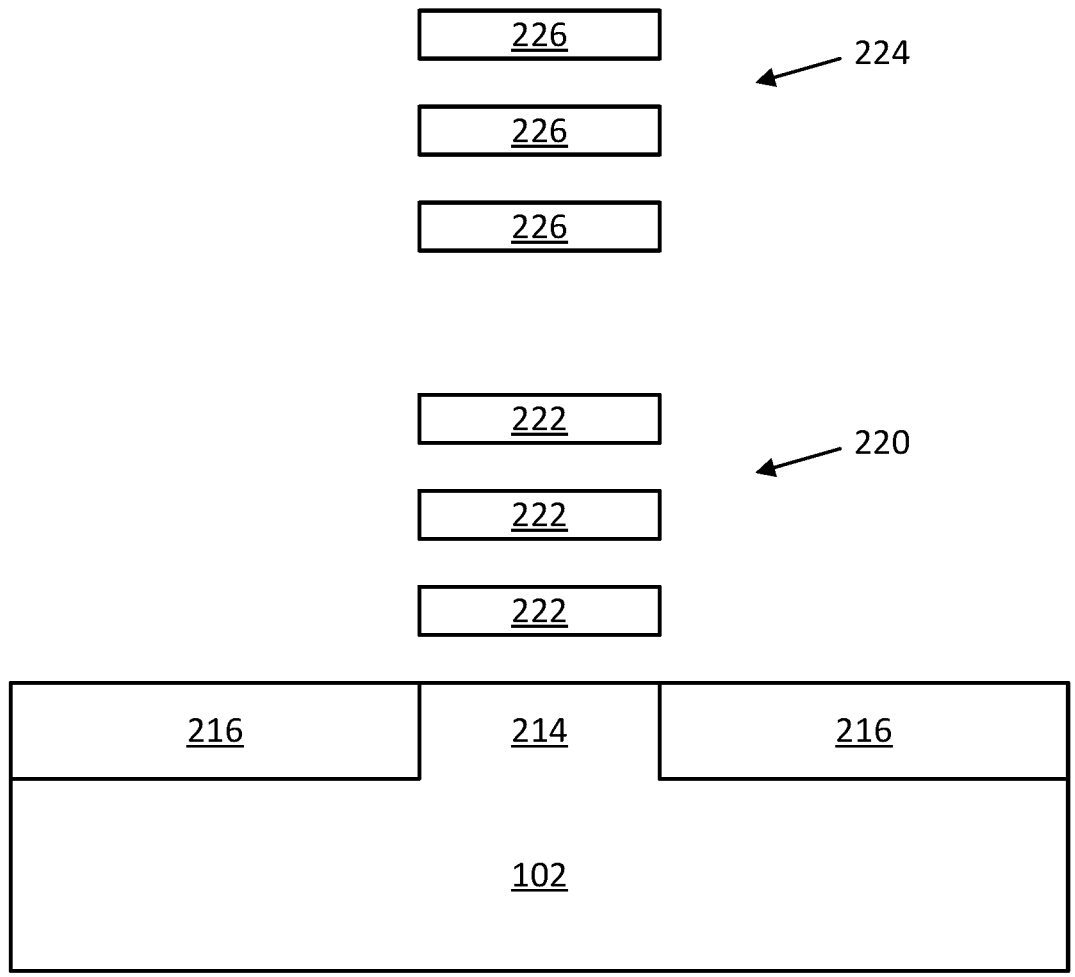

FIG. 2D illustrates a cross-sectional view of the structure shown in FIG. 2C following the removal of sacrificial gate 218, cap layer 213, sacrificial layers 208, and spacer layer 206, according to an embodiment. Any wet or dry etching process may be used to remove sacrificial gate 218 while maintaining the semiconductor material present within the fin. Following the removal of sacrificial gate 218, sacrificial layers 208 and spacer layer 206 are removed using one or more selective isotropic etching processes that remove the material of sacrificial layers 208 and spacer layer 206 but does not remove (or removes very little of) the semiconductor layers 210 and 212. At this point, the released semiconductor layers 210 form nanoribbons 222 of a first semiconductor device 220 that extend between a first source region and a first drain region, and the released semiconductor layers 212 form nanoribbons 226 of a second semiconductor device 224 that extend between a second source region and a second drain region. Cap layer 213 may also be removed, although in some embodiments, cap layer 213 remains following the removal of sacrificial layers 208.

FIGS. 3A-3F include cross-sectional views that collectively illustrate an example process that takes over from the structure shown in FIG. 2D and results in a shared gate structure having an asymmetric gate profile. Each figure shows an example structure that results from the process flow up to that point in time, so the depicted structure evolves as the process flow continues, culminating in the structure shown in FIG. 3F, which is similar to the structure illustrated in FIG. 1A. Example materials and process parameters are given, but the present disclosure is not intended to be limited to any specific such materials or parameters, as will be appreciated.

Figure 3A:
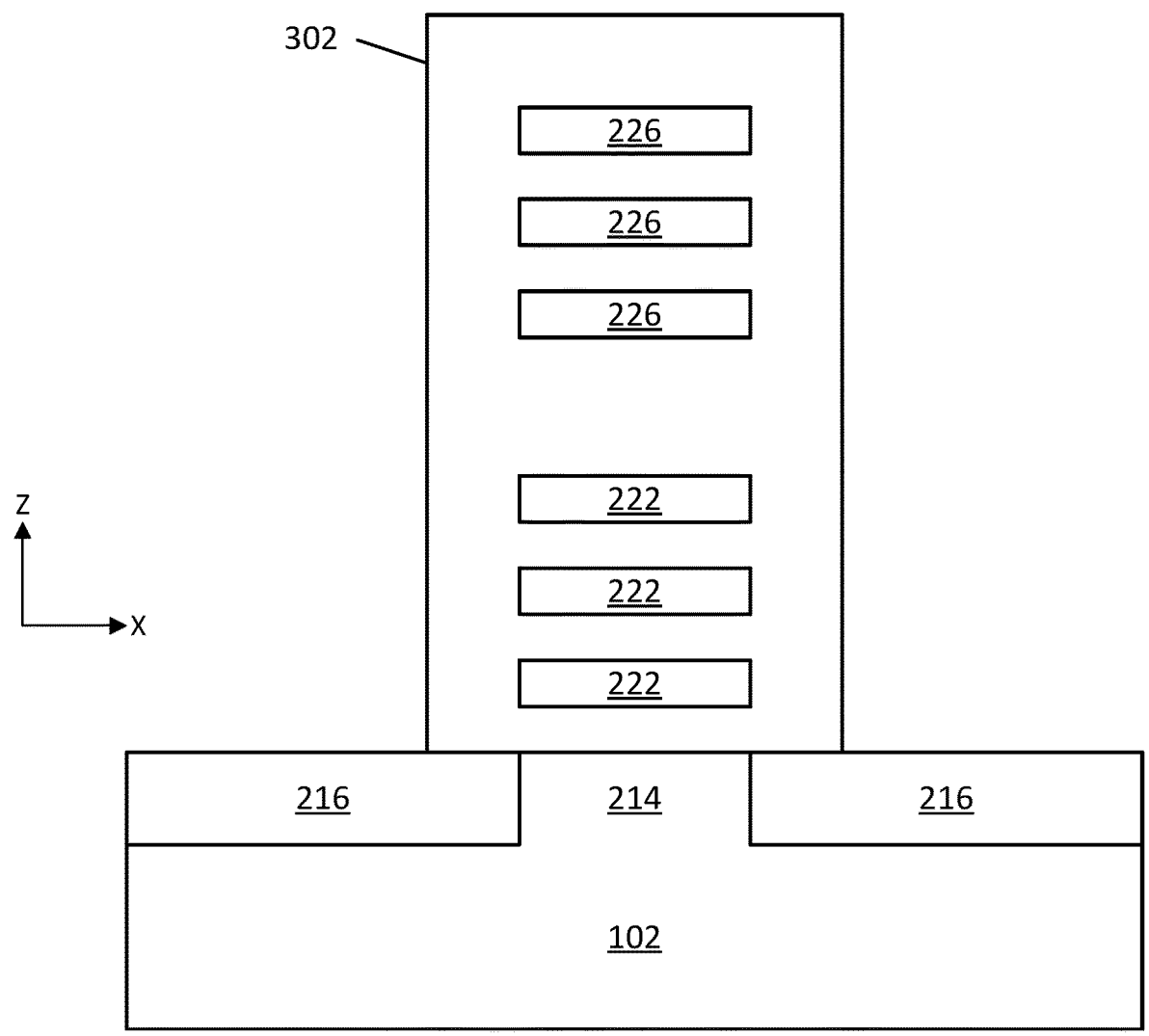
FIGS. 3A-3F are cross-sectional views that collectively illustrate an example process for forming stacked semiconductor devices with a shared gate structure that is T-shaped, in accordance with an embodiment of the present disclosure.

FIG. 3A illustrates a cross-sectional view of the structure shown in FIG. 2D following the formation of a masking layer 302, according to an embodiment. Masking layer 302 may be any suitable hard mask or photoresist material, such as a carbon hard mask (CHM). According to some embodiments, masking layer 302 is patterned such that it protects both nanoribbons 222 and nanoribbons 226. In some embodiments, masking layer 302 extends laterally about the same distance from either ends of nanoribbons 222 and nanoribbons 226 in the X-direction. For example, masking layer 302 may extend between about 5 nm and about 15 nm, such as about 10 nm, on either side of nanoribbons 222 and nanoribbons 226 in the X-direction.

Figure 3B:
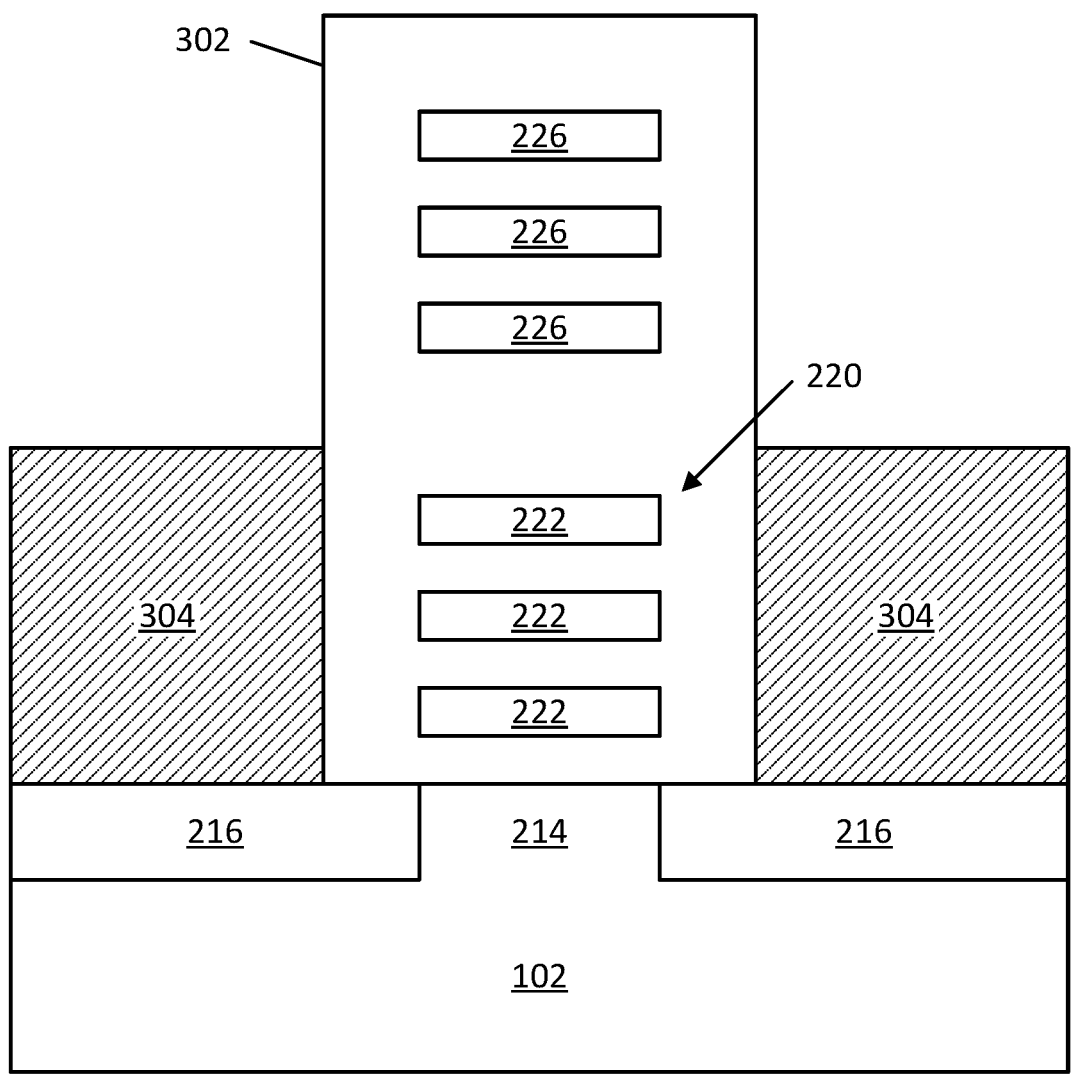

FIG. 3B illustrates a cross-sectional view of the structure shown in FIG. 3A following the formation of first gate plugs 304, according to an embodiment. First gate plugs 304 may be formed from any suitable dielectric material, such as silicon nitride, silicon carbide, silicon carbonitride, or silicon oxide. First gate plugs 304 may be first deposited into any openings through masking layer 302 and then recessed back using an isotropic etching process. In some examples, first gate plugs 304 are recessed to a final height that is above a top-most nanoribbon from nanoribbons 222 and below a bottom-most nanoribbon from nanoribbons 226. First gate plugs 304 may be referred to as a first gate plug on one side of first semiconductor device 220 and a second gate plug on the other side of first semiconductor device 220.

Figure 3C:
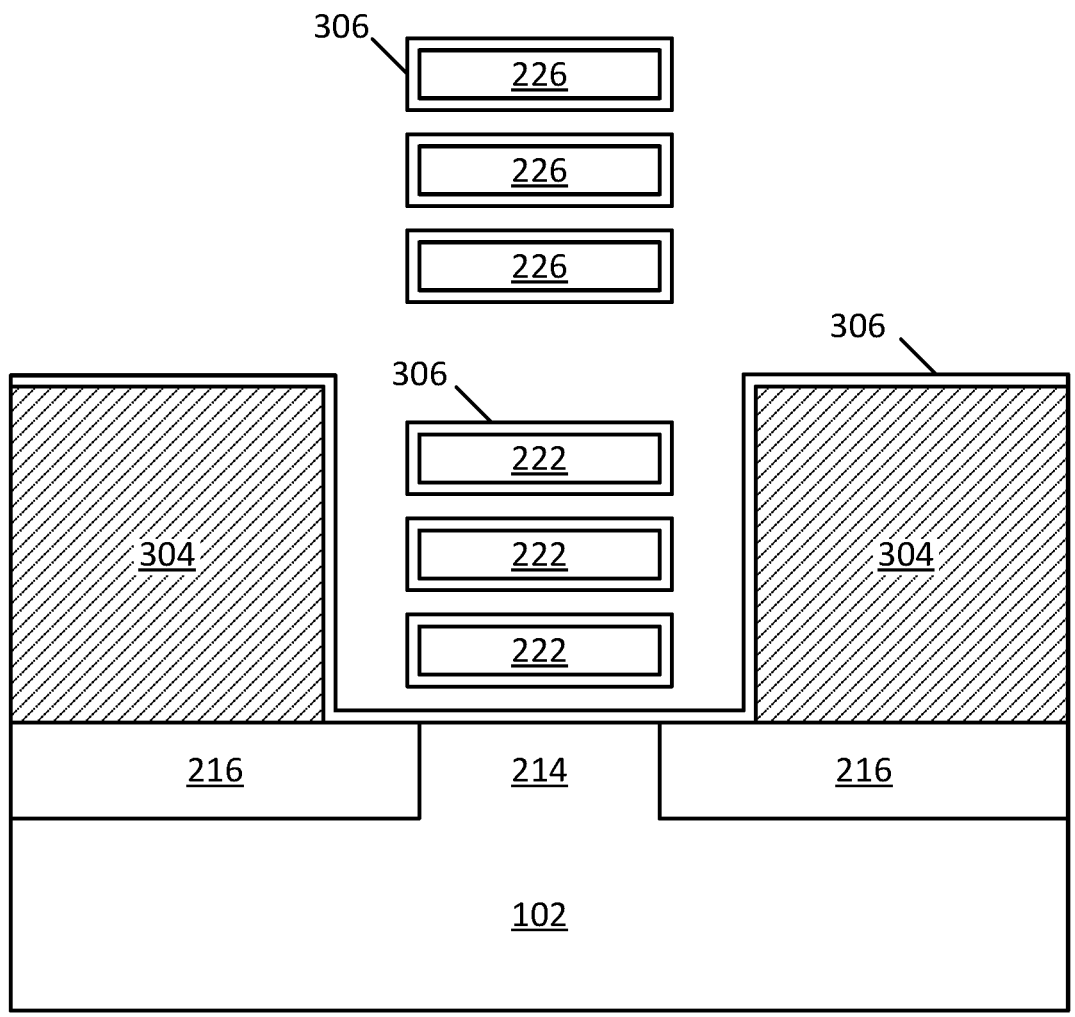

FIG. 3C illustrates a cross-sectional view of the structure shown in FIG. 3B following the removal of masking layer 302 and the formation of gate dielectric 306, according to an embodiment. Masking layer 302 may be removed using an ashing process or via any isotropic etching process.

Gate dielectric 306 may be conformally deposited around nanoribbons 222 and nanoribbons 226 using any suitable deposition process, such as ALD. In some embodiments, gate dielectric 306 is also formed on sidewalls of first gate plugs 304 and on a top surface of first gate plugs 304. In other embodiments, gate dielectric 306 is formed earlier in the process (e.g., before the formation of first gate plugs 304). Gate dielectric 306 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, molybdenum nitride, niobium nitride, and lead zinc niobate, to provide some examples. According to some embodiments, gate dielectric 306 is hafnium oxide with a thickness between about 1 nm and about 5 nm. In some embodiments, gate dielectric 306 may include one or more silicates (e.g., titanium silicate, tungsten silicate, niobium silicate, and silicates of other transition metals). Gate dielectric 306 may be a multilayer structure, in some examples. For instance, gate dielectric 306 may include a first layer on nanoribbons 222/226, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on gate dielectric 306 to improve its quality when a high-k dielectric material is used. In some embodiments, the high-k material can be nitridized to improve its aging resistance.

Figure 3D:
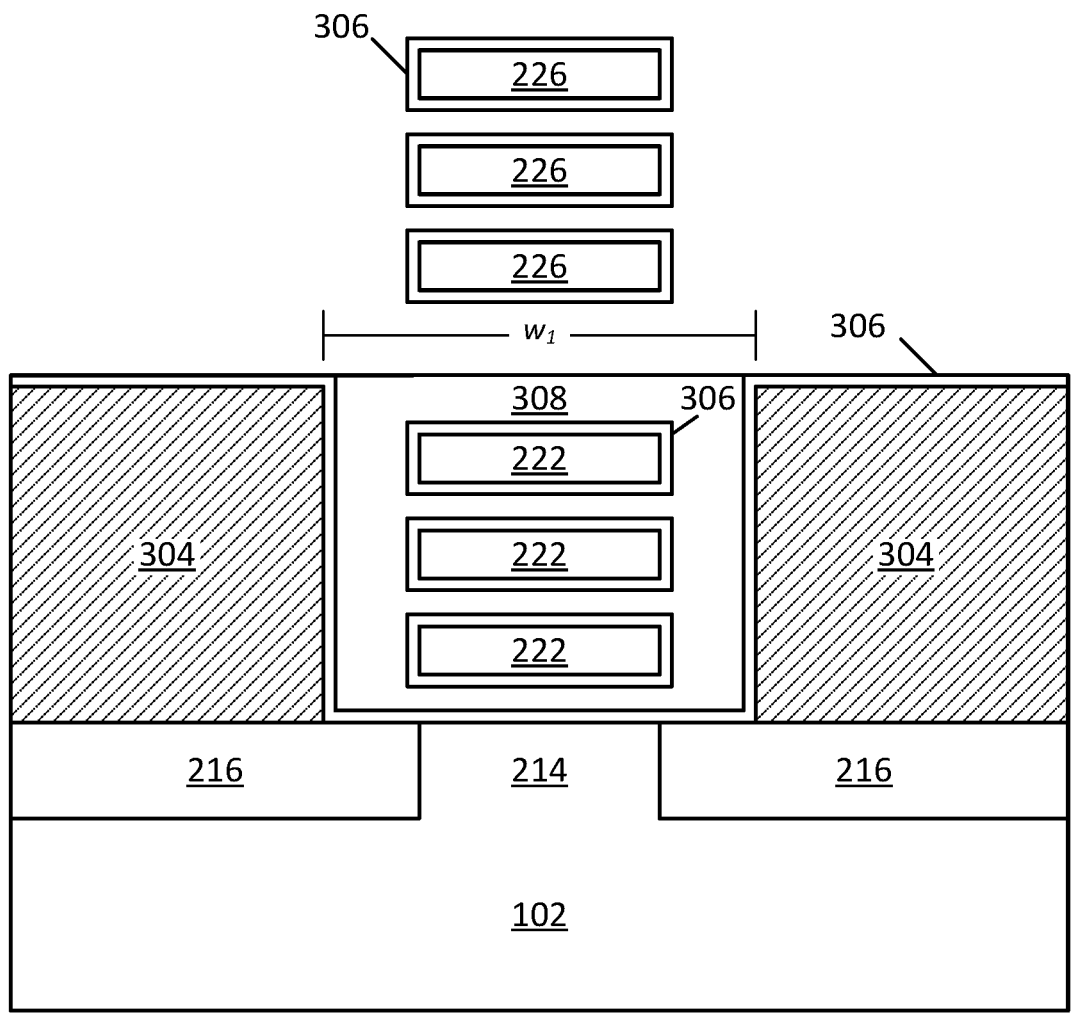

FIG. 3D illustrates a cross-sectional view of the structure shown in FIG. 3C following the formation of a first gate electrode 308 around nanoribbons 222, according to an embodiment. First gate electrode 308 may be recessed to a height that is about the same as, or less than, a height of first gate plugs 304. First gate electrode 308 may be any standard or proprietary gate structure. In some embodiments, first gate electrode 308 includes doped polysilicon, a metal, or a metal alloy. Example suitable metals or metal alloys include aluminum, tungsten, cobalt, molybdenum, ruthenium, titanium, tantalum, copper, and carbides and nitrides thereof. First gate electrode 308 may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. First gate electrode 308 along with the underlying gate dielectric 306 combine to form a first gate structure around nanoribbons 222 and having a width $w_1$ that stretches between first gate plugs 304. As discussed above, width $w_1$ may be between about 20 nm and about 50 nm, in some examples.

Figure 3E:
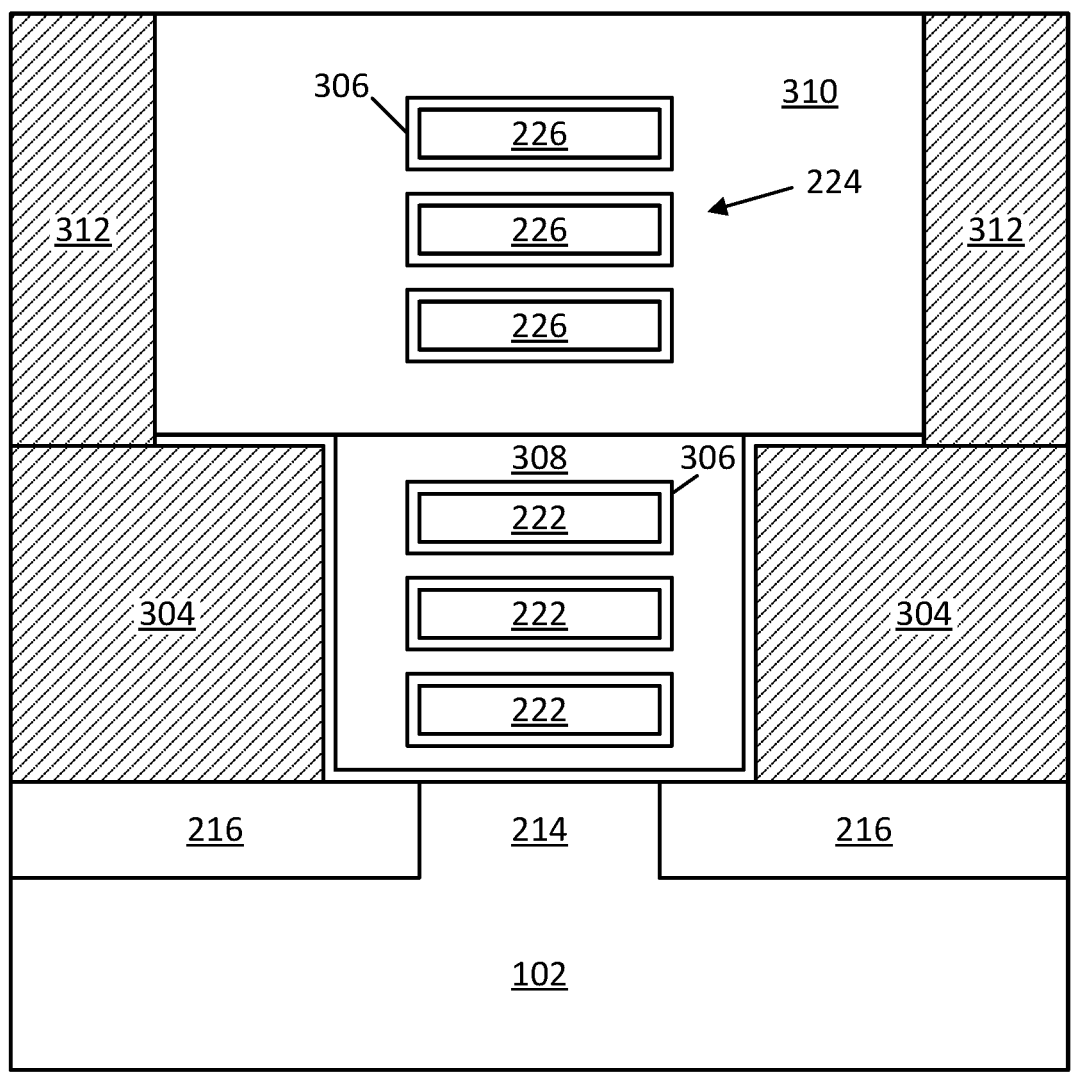

FIG. 3E illustrates a cross-sectional view of the structure shown in FIG. 3D following the formation of a second masking layer 310 and second gate plugs 312, according to an embodiment. Second masking layer 310 may be any suitable hard mask or photoresist material, such as a carbon hard mask (CHM). According to some embodiments, second masking layer 310 is patterned such that it protects nanoribbons 226 and has a width that is greater than the width of the first gate structure. Note that in some embodiments, the patterning of second masking layer 310 removes a portion of gate dielectric 306 on the top surface of first gate plugs 304.

Second gate plugs 312 may be formed from any suitable dielectric material, such as silicon nitride, silicon carbide, silicon carbonitride, or silicon oxide. In some embodiments, second gate plugs 312 comprise the same material as first gate plugs 304. Second gate plugs 312 may be formed adjacent to second masking layer 310 such that second masking layer 310 is flanked on either side by second gate plugs 312. In some embodiments, second gate plugs 312 are formed directly on first gate plugs 304. In some examples, the top surface of second gate plugs 312 is polished using, for example, chemical mechanical polishing (CMP) to planarize the top surface of both gate plugs 312 and second masking layer 310. Second gate plugs 312 may be referred to as a third gate plug on one side of second semiconductor device 224 and a fourth gate plug on the other side of second semiconductor device 224. Second gate plugs 312 may have a smaller width compared to first gate plugs 304.

Figure 3F:
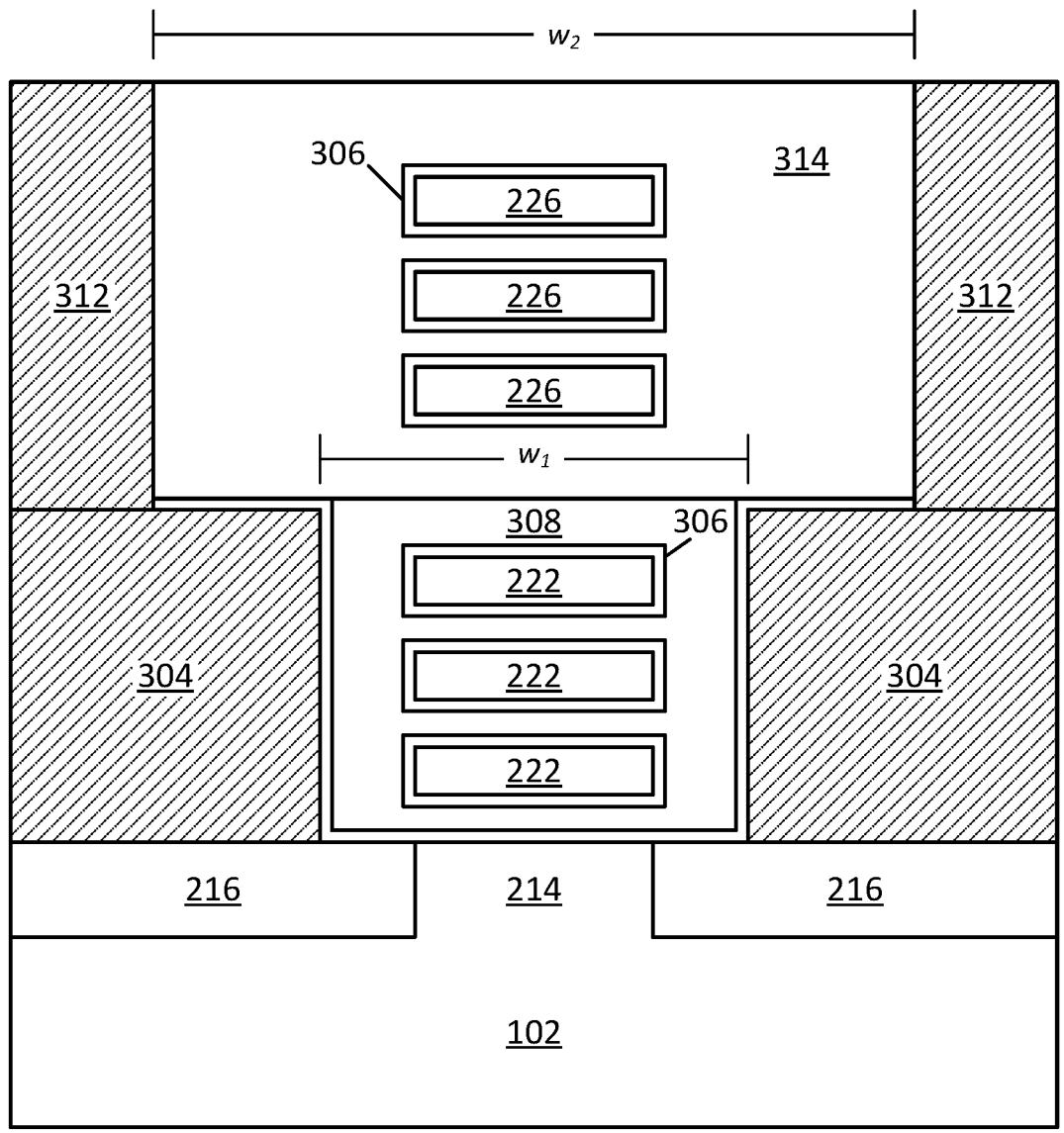

FIG. 3F illustrates a cross-sectional view of the structure shown in FIG. 3E following the removal of second masking layer 310 and the formation of gate electrode 314, according to some embodiments. Second masking layer 310 may be removed using an ashing process or via any isotropic etching process. It should be noted that, in some embodiments, the same gate dielectric 306 remains around nanoribbons 226 when gate electrode 314 is formed. However, in some other embodiments, gate dielectric 306 around nanoribbons 226 is removed and another gate dielectric is formed around nanoribbons 226 prior to the formation of gate electrode 314.

Second gate electrode 314 may have a top surface that is polished to be planar with a top surface of second gate plugs 312. Second gate electrode 314 may be any standard or proprietary gate structure. In some embodiments, second gate electrode 314 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Second gate electrode 314 may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. Second gate electrode 314 along with the underlying gate dielectric 306 around nanoribbons 226 combine to form a second gate structure having a width $w_2$ that stretches between second gate plugs 314. As discussed above, width $w_2$ may be between about 50 nm and about 100 nm), according to some example embodiments.

Note that in some embodiments the step between first gate plugs 304 and second gate plugs 312 may not be clearly defined due to fabrication effects that can etch back corners. Accordingly, the shape of the shared gate electrode that includes both first gate electrode 308 and second gate electrode 314 may look more like a 'V' than a 'T'.

FIGS. 4A-4H' include cross-sectional views that collectively illustrate an example process that takes over from the structure shown in FIG. 2D and results in a split gate structure having an elongated gate contact. Each figure shows an example structure that results from the process flow up to that point in time, so the depicted structure evolves as the process flow continues, culminating in the structure shown in FIG. 4H, which is similar to the structure illustrated in FIG. 1B. FIGS. 4A-4H illustrate cross-section views across the semiconductor devices while corresponding FIGS. 4A'-4H' illustrate cross section views taken across the dashed line in each of FIGS. 4A-4H. Example materials and process parameters are given, but the present disclosure is not intended to be limited to any specific such materials or parameters, as will be appreciated.

Figure 4A:
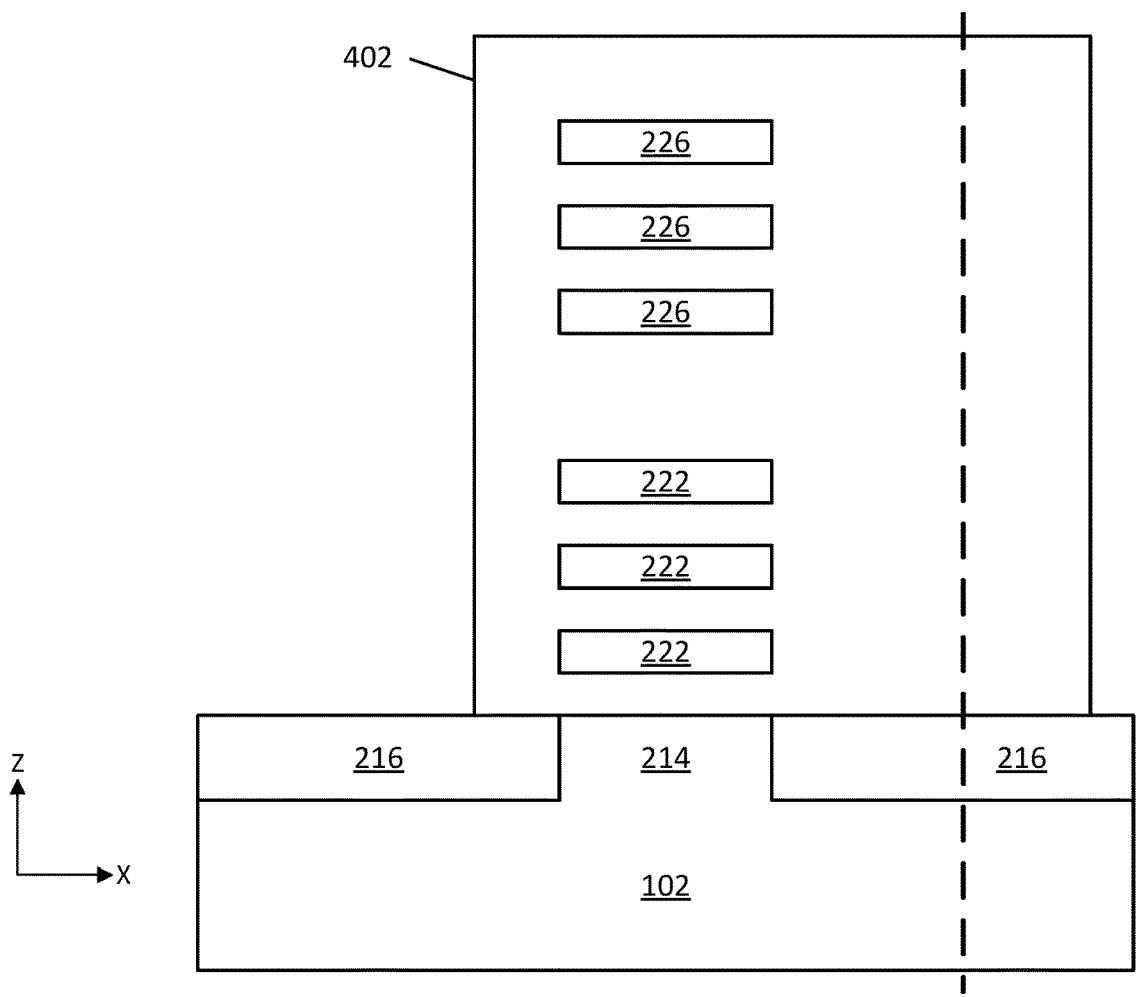
FIGS. 4A-4H' are cross-sectional views that collectively illustrate an example process for forming stacked semiconductor devices with a split gate structure and an elongated contact that lands on the bottom gate of the split gat structure, in accordance with an embodiment of the present disclosure.
Figure 4A:
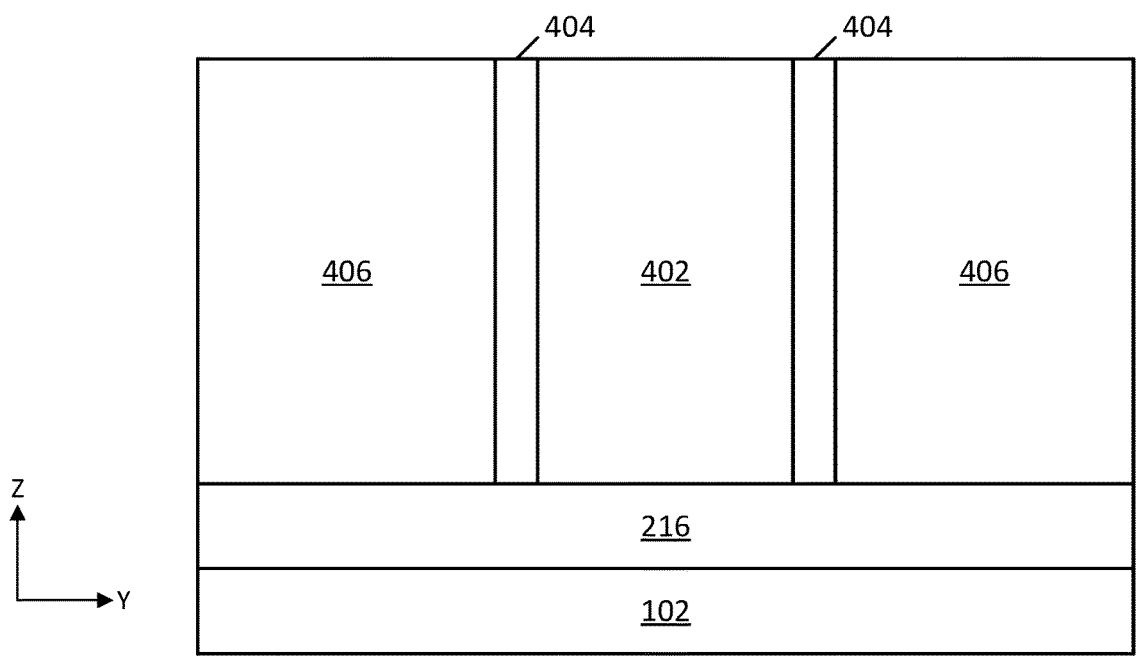

FIG. 4A illustrates a cross-sectional view of the structure shown in FIG. 2D following the formation of a masking layer 402, according to an embodiment. FIG. 4A' illustrates an orthogonal cross-section view across the dashed line in FIG. 4A that passes next to the semiconductor devices. Masking layer 402 may be any suitable hard mask or photoresist material, such as a carbon hard mask (CHM). According to some embodiments, masking layer 402 is patterned such that it protects both nanoribbons 222 and nanoribbons 226. In some embodiments, masking layer 402 extends further laterally from one side of nanoribbons 222 and nanoribbons 226 compared to the other side in the X-direction. For example, masking layer 402 may extend between about 5 nm and about 15 nm from one side of nanoribbons 222 and nanoribbons 226 along the X-axis, and may extend between about 30 nm and about 80 nm from the opposite side of nanoribbons 222 and nanoribbons 226 along the X-axis.

FIG. 4A' illustrates the orthogonal view adjacent to the semiconductor devices, thus showing masking layer 402 within a trench between spacer structures 404. According to some embodiments, spacer structures 404 are any suitable dielectric material, such as silicon nitride. Outside of spacer structures 404 are dielectric plugs 406, according to some embodiments. Dielectric plugs 406 may include any number of interlayer dielectrics (ILD) or other dielectric fill materials.

Figure 4B:
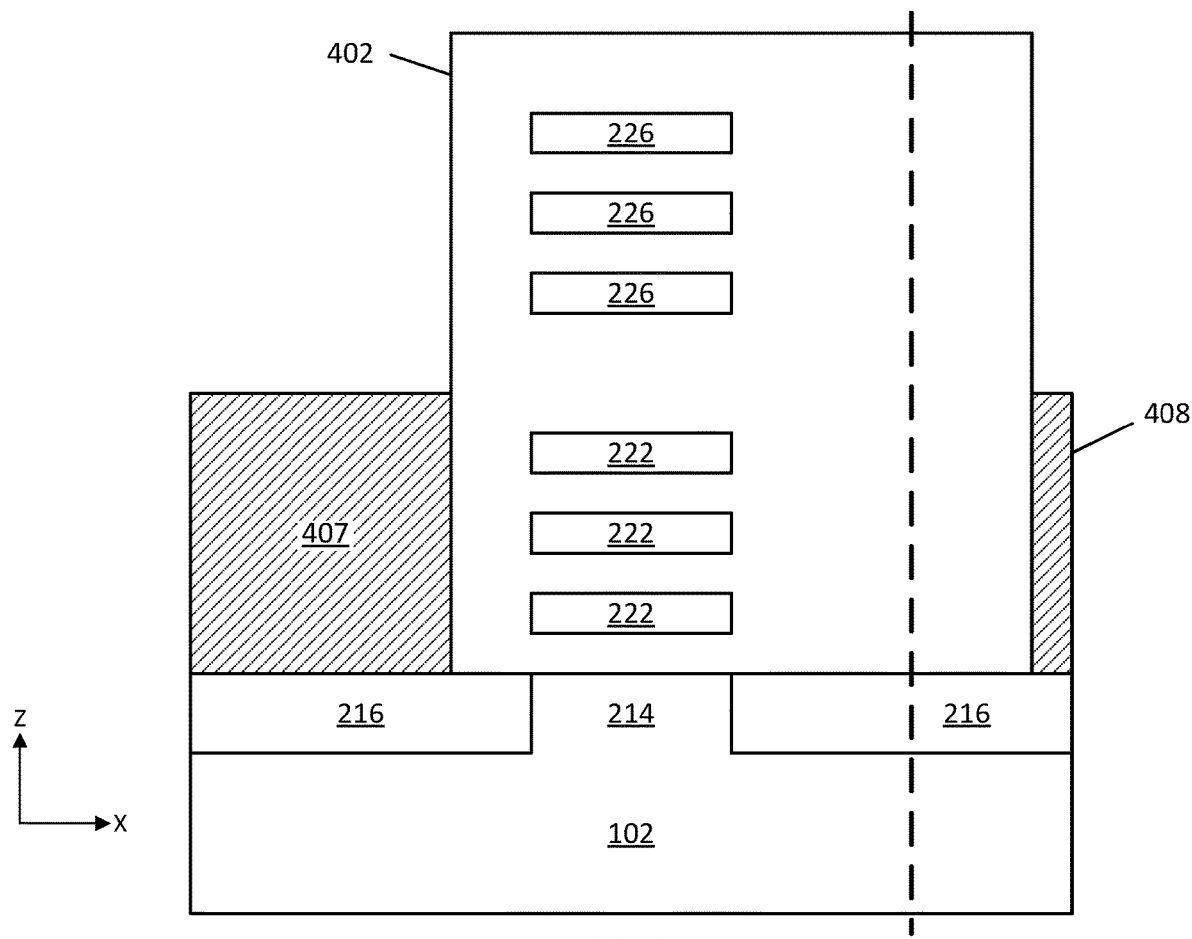
Figure 4B:
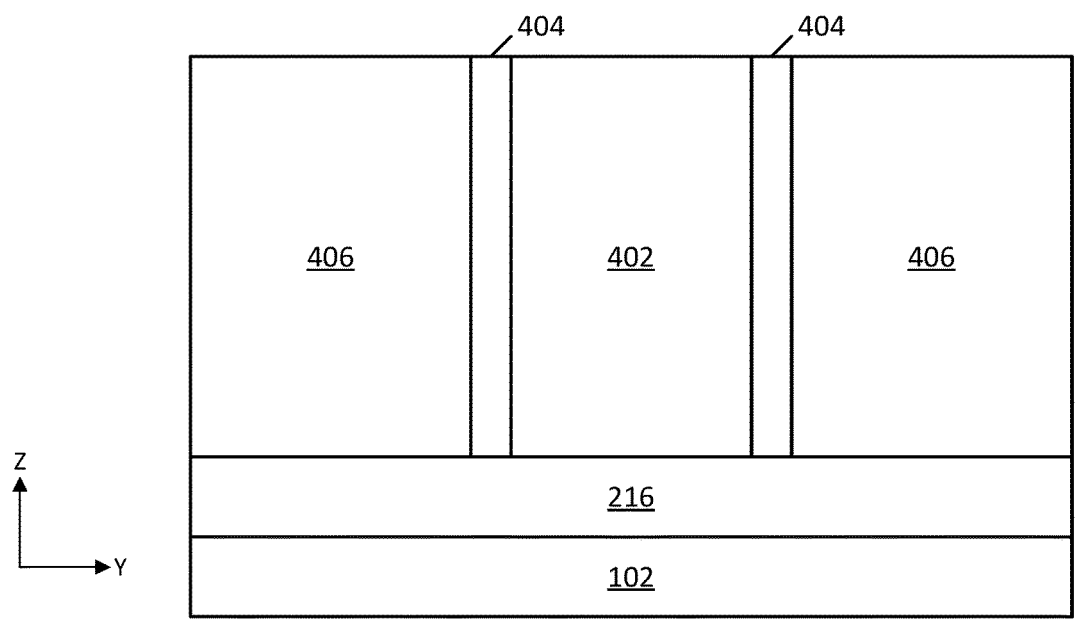

FIG. 4B illustrates a cross-sectional view of the structure shown in FIG. 4A following the formation of a first gate plug 407 and a second gate plug 408, according to an embodiment. Gate plugs 407/408 may be formed from any suitable dielectric material, such as silicon nitride, silicon carbide, silicon carbonitride, or silicon oxide. Gate plugs 407/408 may be first deposited into openings through masking layer 402 and then recessed back using an isotropic etching process. In some examples, gate plugs 407/408 are recessed to a final height that is above a top-most nanoribbon from nanoribbons 222 and below a bottom-most nanoribbon from nanoribbons 226.

Figure 4C:
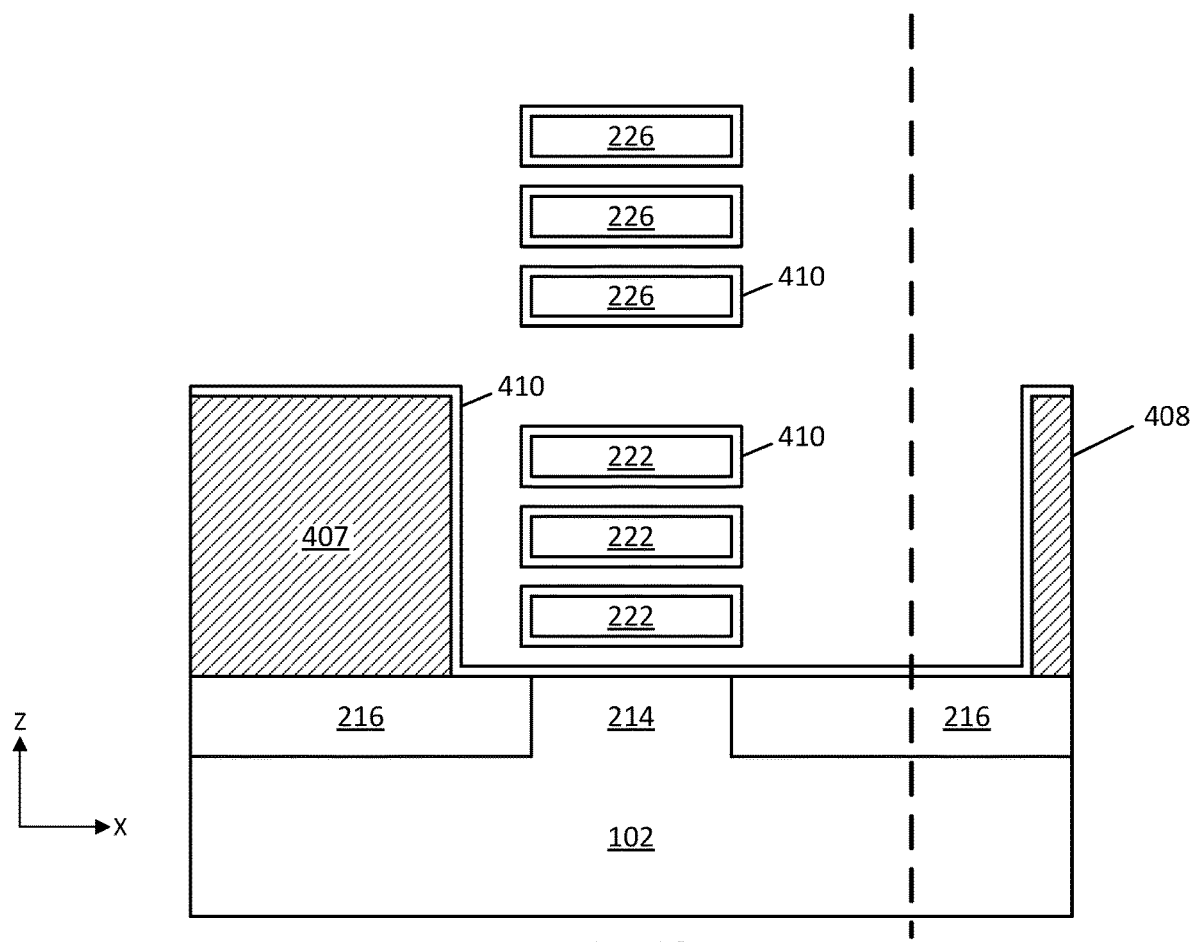
Figure 4C:
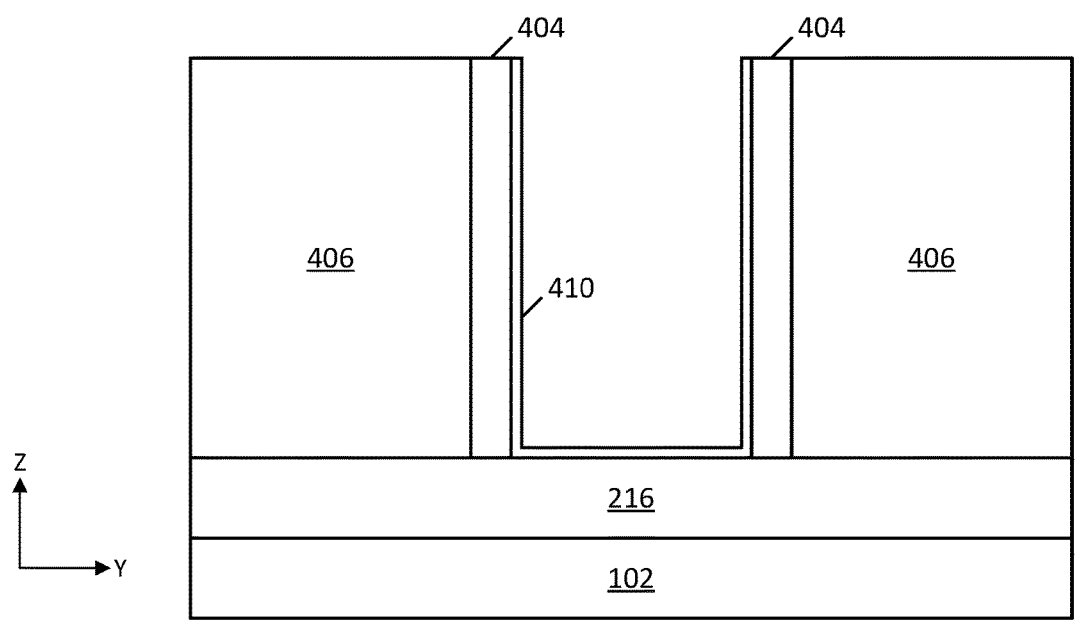

FIG. 4C illustrates a cross-sectional view of the structure shown in FIG. 4B following the removal of masking layer 402 and the formation of gate dielectric 410, according to an embodiment. Masking layer 402 may be removed using an ashing process or via any isotropic etching process. The description above with regards to gate dielectric 306 applies equally to gate dielectric 410. FIG. 4C' illustrates how gate dielectric 410 may also be formed on the inner sidewalls of spacer structures 404.

Figure 4D:
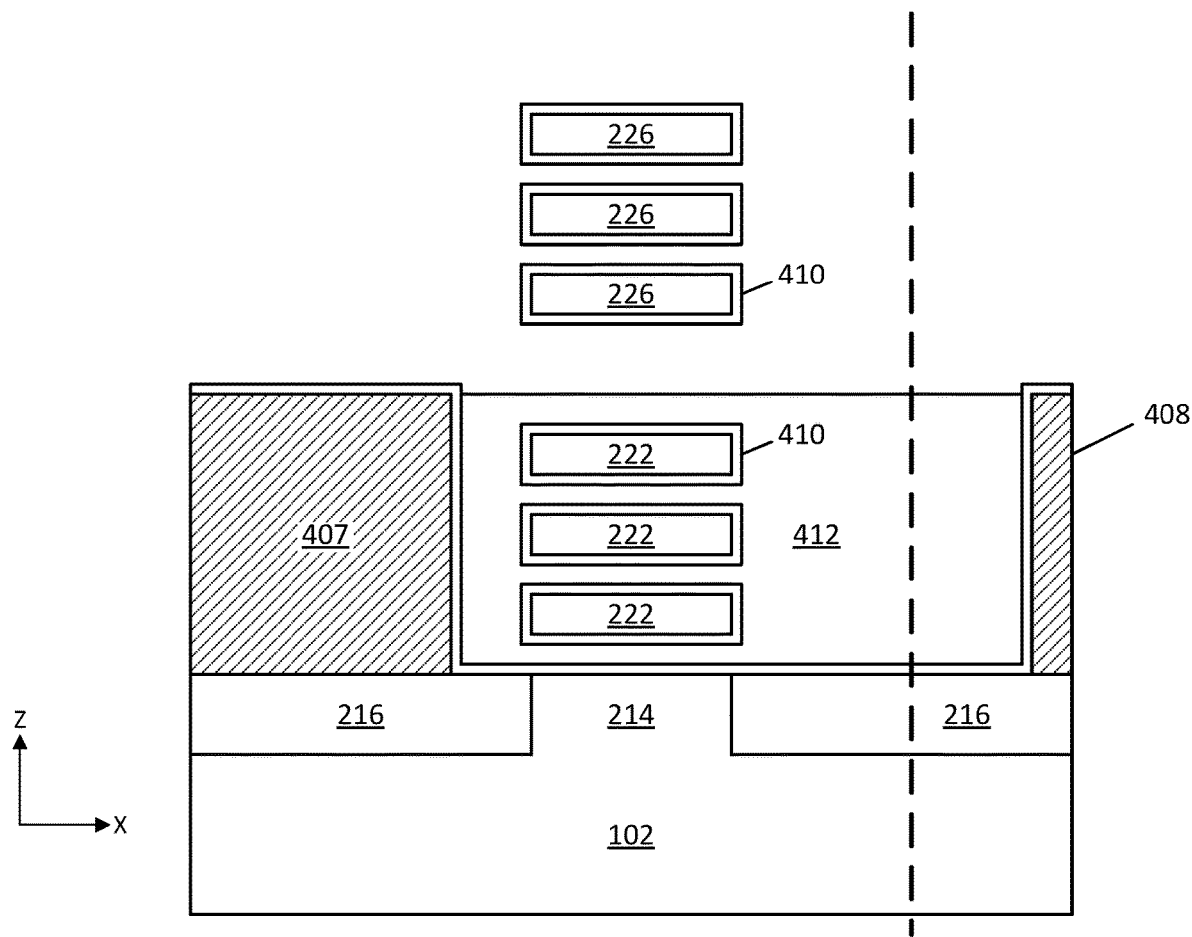
Figure 4D:
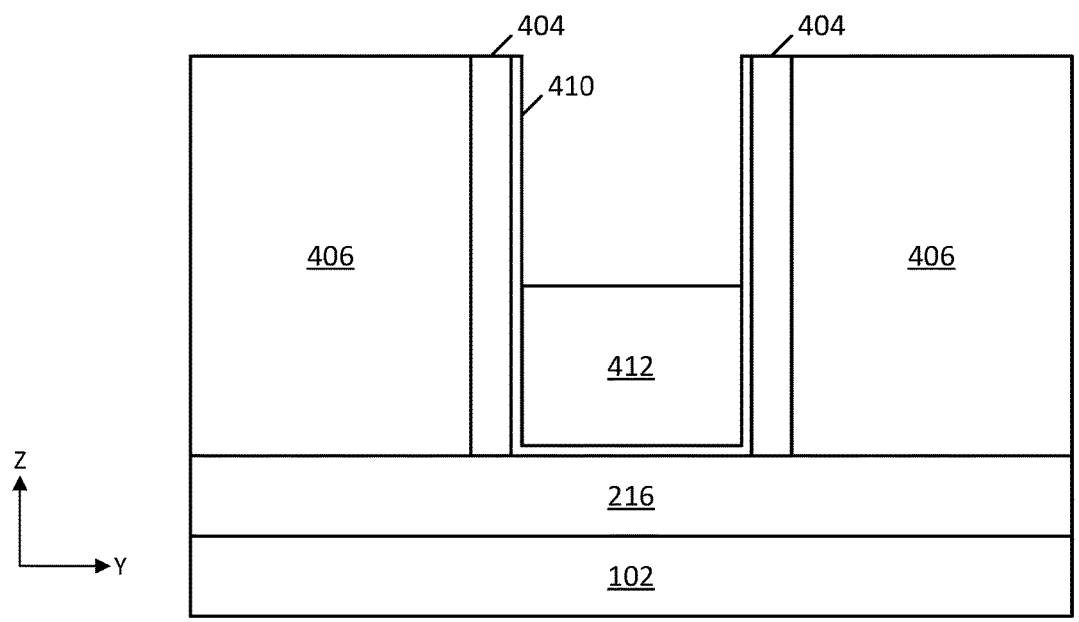

FIG. 4D illustrates a cross-sectional view of the structure shown in FIG. 4C following the formation of a first gate electrode 412 around nanoribbons 222, according to an embodiment. First gate electrode 412 may be recessed to a height that is about the same as, or less than, a height of gate plugs 407/408. First gate electrode 410 may be any standard or proprietary gate structure. In some embodiments, first gate electrode 410 includes doped polysilicon, a metal, or a metal alloy. Example suitable metals or metal alloys include aluminum, tungsten, cobalt, molybdenum, ruthenium, titanium, tantalum, copper, and carbides and nitrides thereof. First gate electrode 412 may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. First gate electrode 412 along with the underlying gate dielectric 410 combine to form a first gate structure around nanoribbons 222 that stretches between first gate plug 407 and second gate plug 408. FIG. 4D' illustrates how first gate electrode 412 fills only a portion of the entire gate trench between spacer structures 404.

Figure 4E:
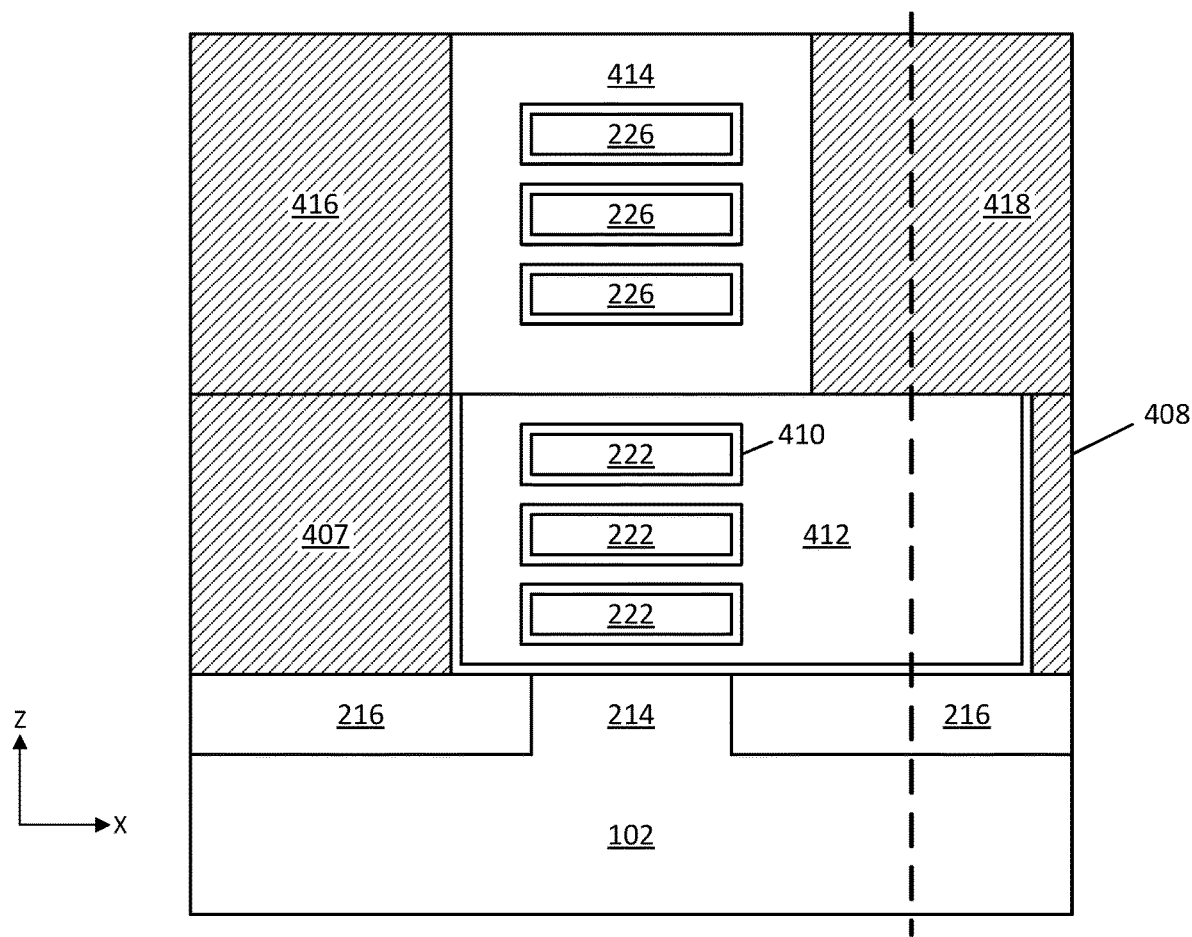
Figure 4E:
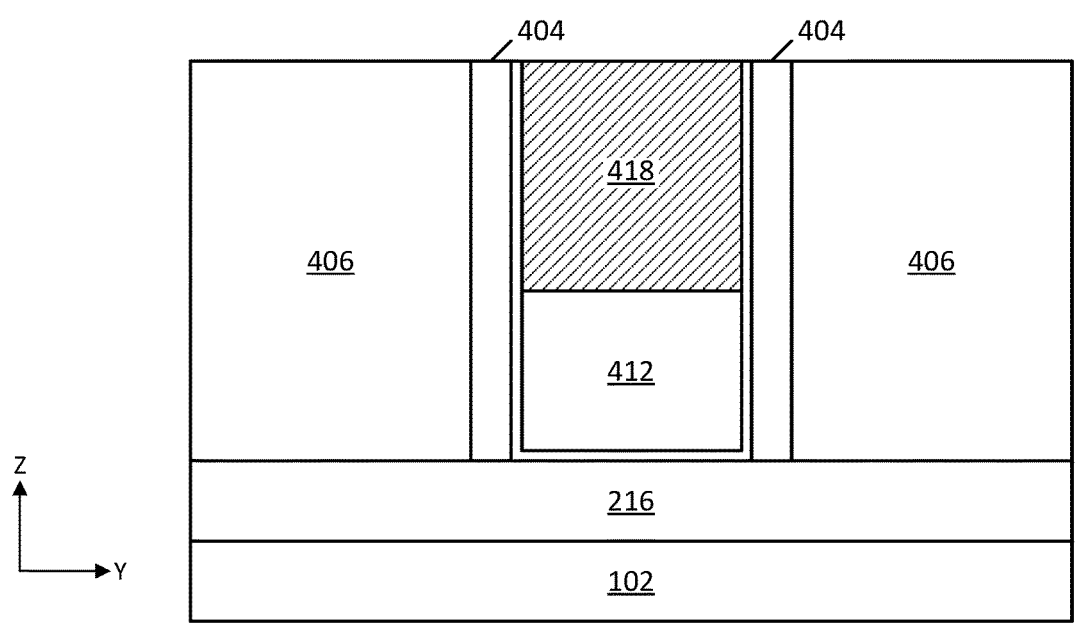

FIG. 4E illustrates a cross-sectional view of the structure shown in FIG. 4D following the formation of a second masking layer 414, a third gate plug 416, and a fourth gate plug 418, according to an embodiment. Second masking layer 414 may be any suitable hard mask or photoresist material, such as a carbon hard mask (CHM). According to some embodiments, second masking layer 414 is patterned such that it protects nanoribbons 226. Note that in some embodiments, the patterning of second masking layer 414 removes gate dielectric 410 on the top surface of first gate plug 407 and second gate plug 408.

Gate plugs 416/418 may be formed from any suitable dielectric material, such as silicon nitride, silicon carbide, silicon carbonitride, or silicon oxide. In some embodiments, third and fourth gate plugs 416/418 comprise the same material as first and second gate plugs 407/408. Gate plugs 416/418 may be formed adjacent to second masking layer 414 such that second masking layer 414 is flanked on either side by third gate plug 416 and fourth gate plug 418. In some embodiments, third gate plug 416 is formed directly on first gate plugs 407. A sidewall of third gate plug 416 may be aligned in the vertical direction with a sidewall of first gate plug 407. In some embodiments, fourth gate plug 418 is formed over a portion of first gate structure 412. Fourth gate plug 418 may also be formed over at least a portion of second gate plug 408. In some examples, the top surface of gate plugs 416/418 is polished using, for example, CMP to planarize the top surface of gate plugs 416/418 and second masking layer 414. In some embodiments, the first gate structure extends laterally beneath fourth gate plug 418 by at least 40 nm, at least 50 nm, at least 75 nm, or at least 100 nm. FIG. 4E' illustrates how fourth gate plug 418 may fill a remaining portion of the trench between spacer structures 404 over first gate electrode 412.

Figure 4F:
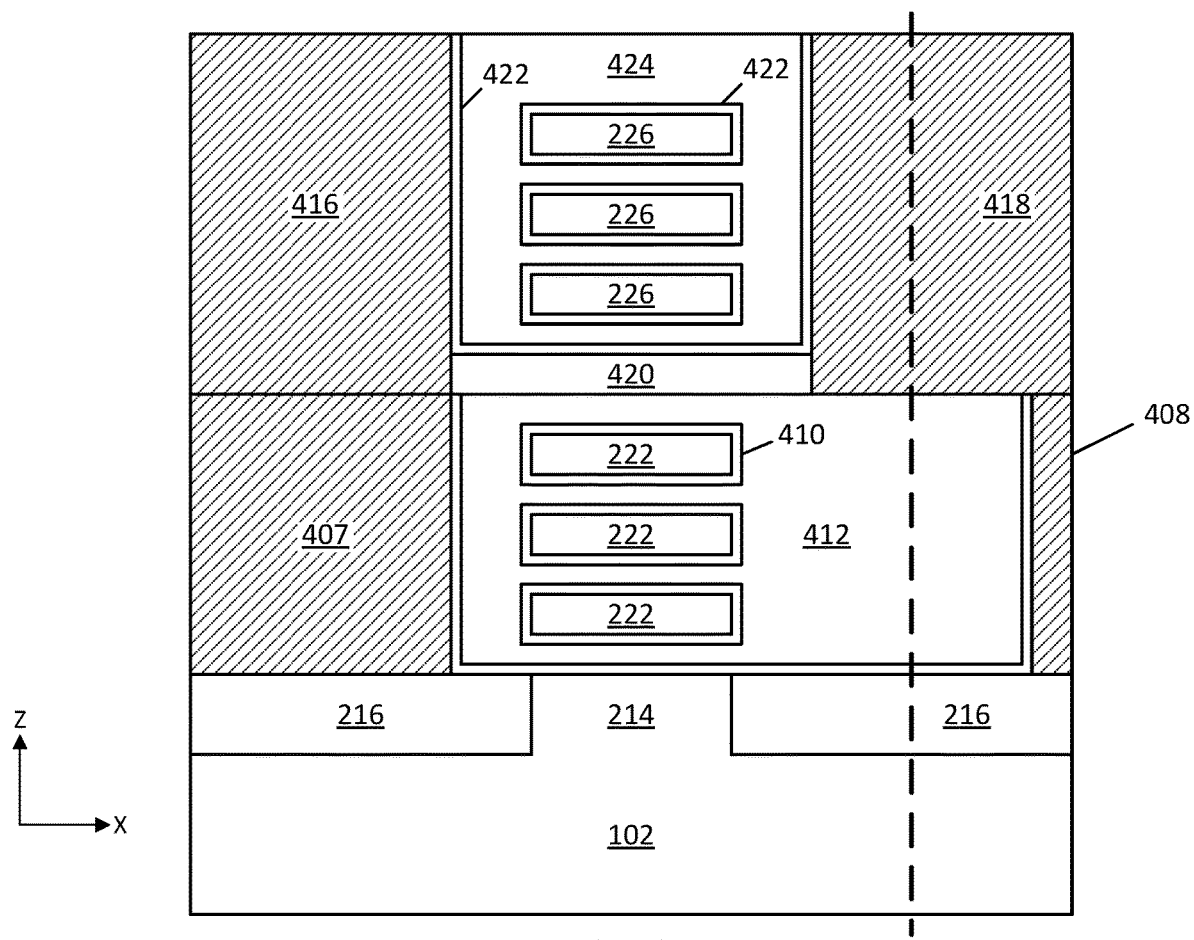
Figure 4F:
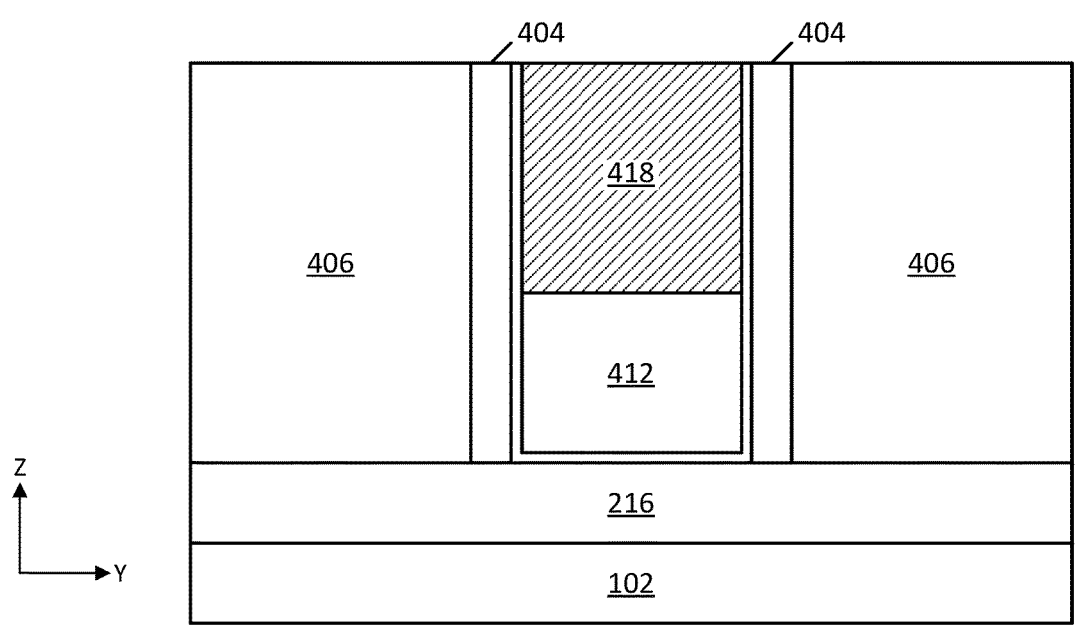

FIG. 4F illustrates a cross-sectional view of the structure shown in FIG. 4E following the removal of second masking layer 414 and the formation of a dielectric layer 420 and a second gate electrode 424 around nanoribbons 226, according to an embodiment. Second masking layer 414 may be removed using an ashing process or via any isotropic etching process. It should be noted that, in some embodiments, the same gate dielectric 410 remains around nanoribbons 226 when second gate electrode 424 is formed. However, in some other embodiments, gate dielectric 410 around nanoribbons 226 is removed and another gate dielectric 422 is formed around nanoribbons 226 prior to the formation of second gate electrode 424. The description above for gate dielectric 410 applies equally to gate dielectric 422.

Dielectric layer 420 may be deposited in the trench around nanoribbons 226 and recessed to a final thickness such that dielectric layer 420 is between a top-most nanoribbon of nanoribbons 222 and a bottom-most nanoribbon of nanoribbons 226. Dielectric layer 420 may have a thickness between about 15 nm and about 40 nm. Dielectric layer 420 may be any suitable dielectric material such as silicon dioxide, aluminum oxide, or silicon oxycarbonitride. In some embodiments, dielectric layer 420 is deposited using ALD to a smaller thickness between about 2 nm and about 10 nm.

Second gate electrode 424 may have a top surface that is polished to be planar with a top surface of gate plugs 416/418. Second gate electrode 424 may be any standard or proprietary gate structure. In some embodiments, second gate electrode 424 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Second gate electrode 424 may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. Second gate electrode 424 along with the underlying gate dielectric 422 around nanoribbons 226 combine to form a second gate structure having a width that stretches between third gate plug 416 and fourth gate plug 418. The width of the second gate structure may be less than the width of the first gate structure. Dielectric layer 420 isolates the first gate structure from the second gate structure in a split-gate design.

Figure 4G:
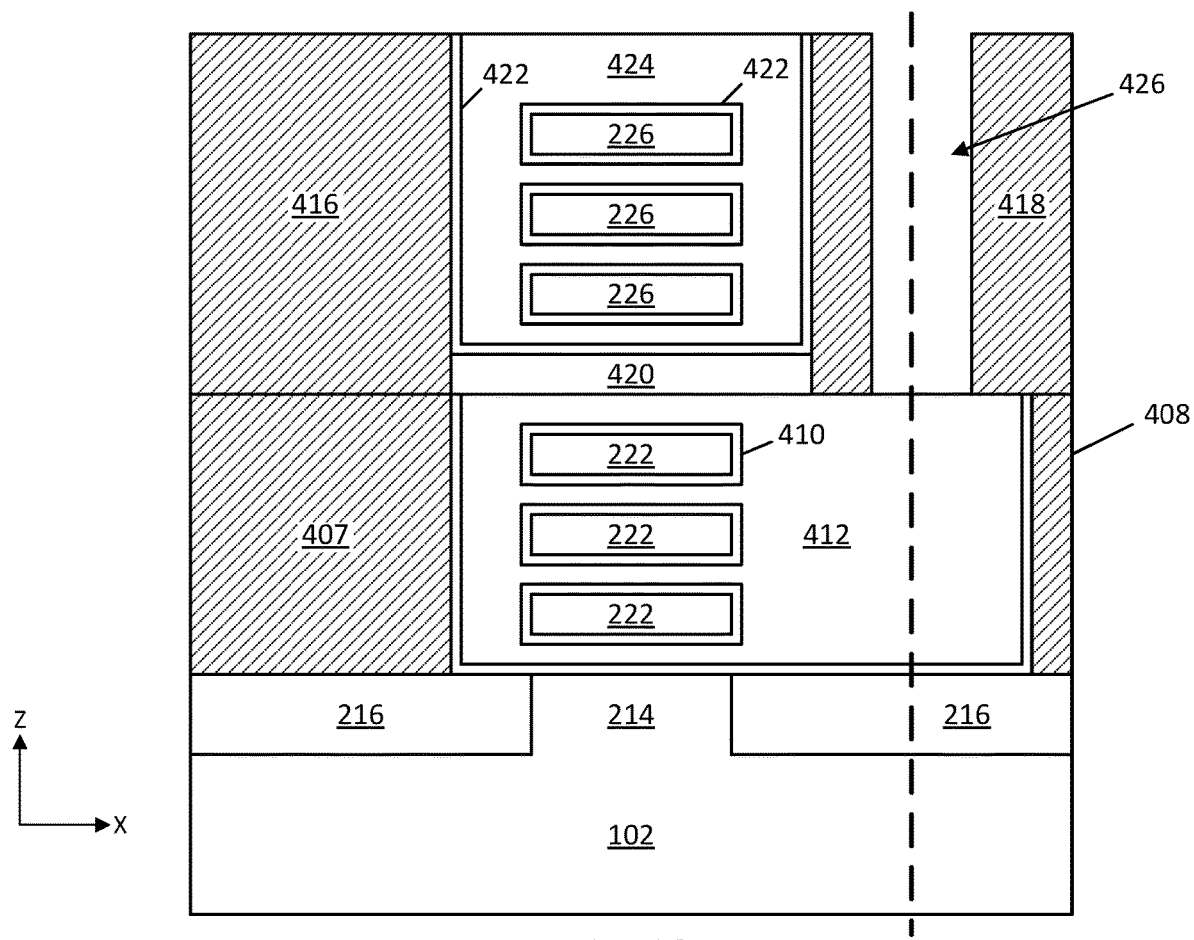
Figure 4G:
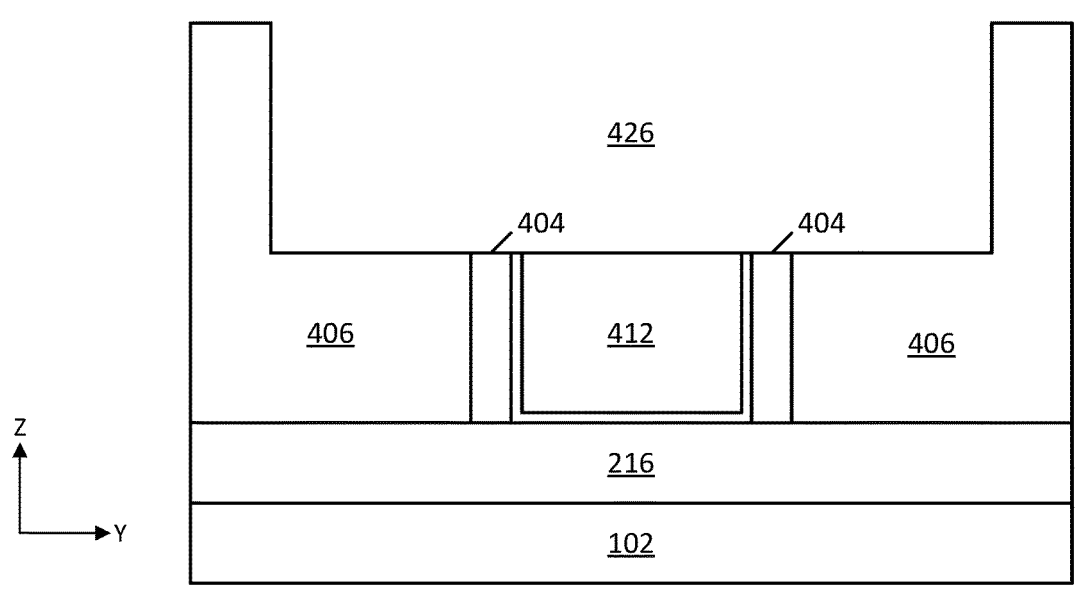

FIG. 4G illustrates a cross-sectional view of the structure shown in FIG. 4F following the formation of a trench recess 426 through fourth gate plug 418, according to an embodiment. An anisotropic etching process, such as RIE, may be used to form recess 426 through fourth gate plug 418 until at least a portion of the underlying first gate electrode 412 is exposed. According to some embodiments, trench recess 426 is flanked on either side by portions of fourth gate plug 418. FIG. 4G' illustrates how trench recess 426 extends beyond the gate trench in the Y-direction, according to some embodiments. For example, trench recess 426 extends over gate spacers 404 and into at least a portion of dielectric plugs 406 on either side of the gate trench.

Figure 4H:
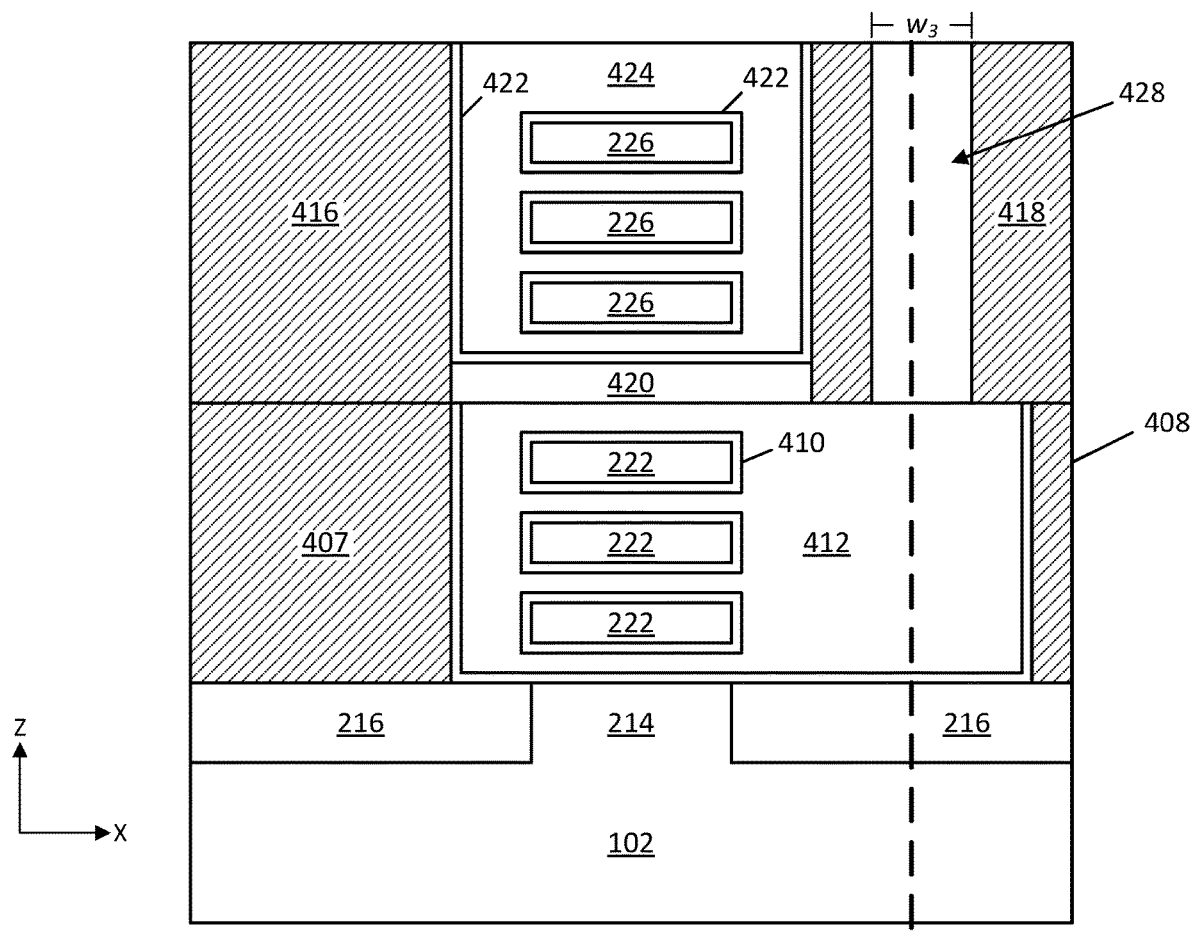
Figure 4H:
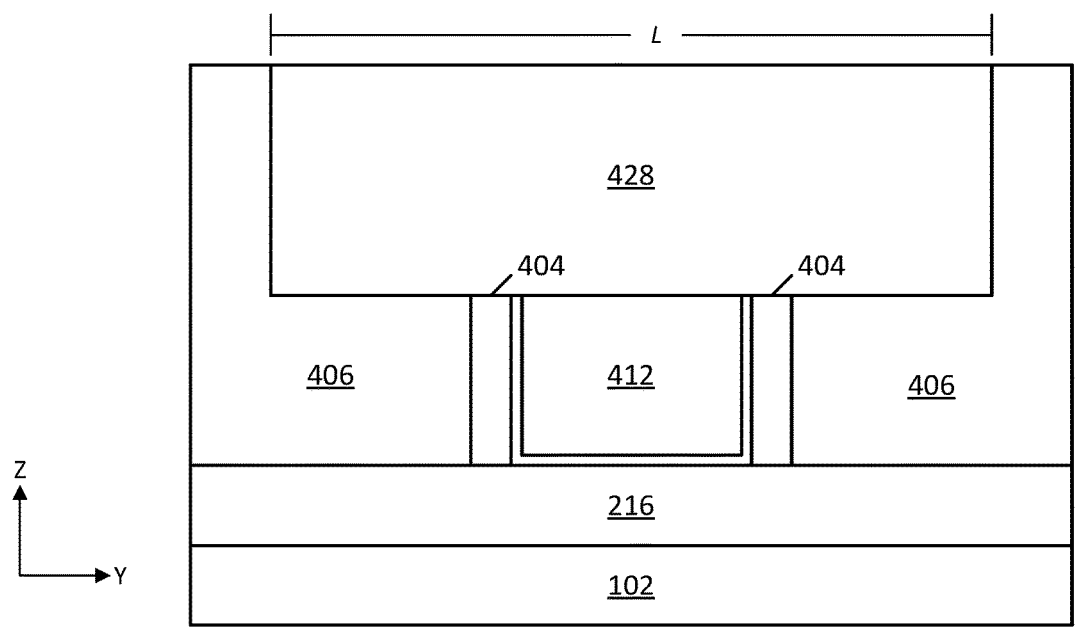

FIG. 4H illustrates a cross-sectional view of the structure shown in FIG. 4G following the formation of a gate contact 428 within trench recess 426, according to an embodiment. Gate contact 428 may directly contact at least a portion of first gate electrode 412 while crossing first gate electrode 412 in an orthogonal direction. Gate contact 428 may be any suitably conductive material, such as any metal. In some examples, gate contact 428 includes tungsten, copper, titanium, ruthenium, cobalt, or any alloys thereof. Gate contact 428 has a width $w_3$ in the X-direction that is sufficiently small enough to ensure that gate contact 428 is within a total width of fourth gate plug 418. However, according to some embodiments, gate contact 428 includes a length L, as seen in FIG. 4H', that is larger than its width $w_3$. The length L of gate contact 428 may be at least twice as long, or at least three times as long as its width $w_3$. In some examples, gate contact 428 has a width $w_3$ between about 10 nm and about 20 nm and a length L between about 20 nm and about 60 nm. According to some embodiments, the length L of gate contact 428 in the Y-direction is longer than the length of the first gate structure in the Y-direction. For example, gate contact 428 may be twice as long as the first gate structure in the Y-direction.

Figure 5:
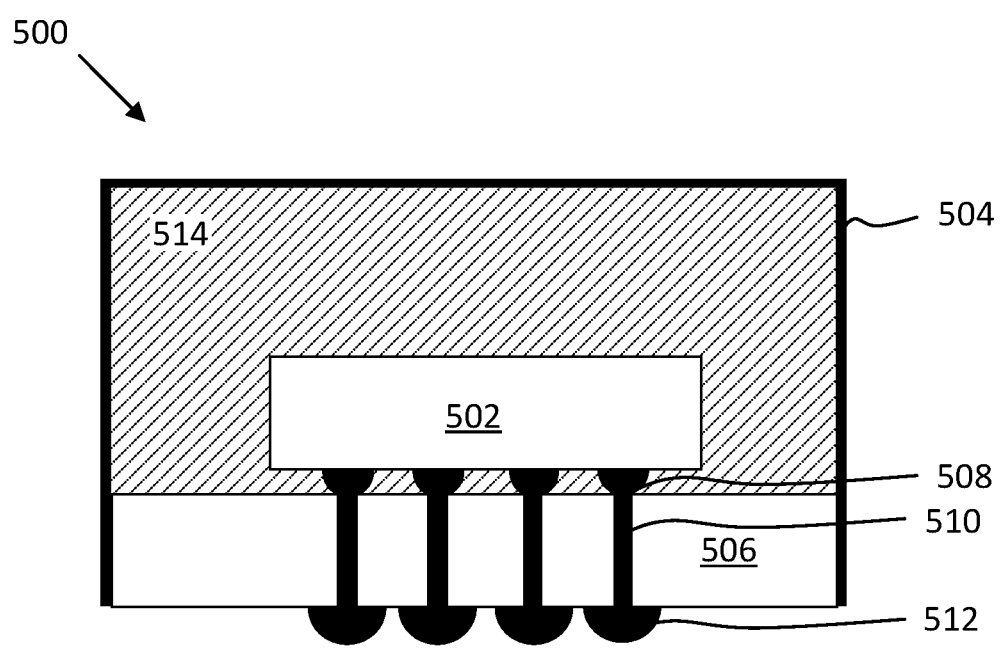
FIG. 5 illustrates a cross-section view of a chip package containing one or more semiconductor dies, in accordance with some embodiments of the present disclosure.

FIG. 5 illustrates an example embodiment of a chip package 500, in accordance with an embodiment of the present disclosure. As can be seen, chip package 500 includes one or more dies 502. One or more dies 502 may include at least one integrated circuit having semiconductor devices, such as any of the semiconductor devices disclosed herein. One or more dies 502 may include any other circuitry used to interface with other devices formed on the dies, or other devices connected to chip package 500, in some example configurations.

As can be further seen, chip package 500 includes a housing 504 that is bonded to a package substrate 506. The housing 504 may be any standard or proprietary housing, and may provide, for example, electromagnetic shielding and environmental protection for the components of chip package 500. The one or more dies 502 may be conductively coupled to a package substrate 506 using connections 508, which may be implemented with any number of standard or proprietary connection mechanisms, such as solder bumps, ball grid array (BGA), pins, or wire bonds, to name a few examples. Package substrate 506 may be any standard or proprietary package substrate, but in some cases includes a dielectric material having conductive pathways (e.g., including conductive vias and lines) extending through the dielectric material between the faces of package substrate 506, or between different locations on each face. In some embodiments, package substrate 506 may have a thickness less than 1 millimeter (e.g., between 0.1 millimeters and 0.5 millimeters), although any number of package geometries can be used. Additional conductive contacts 512 may be disposed at an opposite face of package substrate 506 for conductively contacting, for instance, a printed circuit board (PCB). One or more vias 510 extend through a thickness of package substrate 506 to provide conductive pathways between one or more of connections 508 to one or more of contacts 512. Vias 510 are illustrated as single straight columns through package substrate 506 for ease of illustration, although other configurations can be used (e.g., damascene, dual damascene, through-silicon via, or an interconnect structure that meanders through the thickness of substrate 506 to contact one or more intermediate locations therein). In still other embodiments, vias 510 are fabricated by multiple smaller stacked vias, or are staggered at different locations across package substrate 506. In the illustrated embodiment, contacts 512 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 512, to inhibit shorting.

In some embodiments, a mold material 514 may be disposed around the one or more dies 502 included within housing 504 (e.g., between dies 502 and package substrate 506 as an underfill material, as well as between dies 502 and housing 504 as an overfill material). Although the dimensions and qualities of the mold material 514 can vary from one embodiment to the next, in some embodiments, a thickness of mold material 514 is less than 1 millimeter. Example materials that may be used for mold material 514 include epoxy mold materials, as suitable. In some cases, the mold material 514 is thermally conductive, in addition to being electrically insulating.

Methodology

Figure 6:
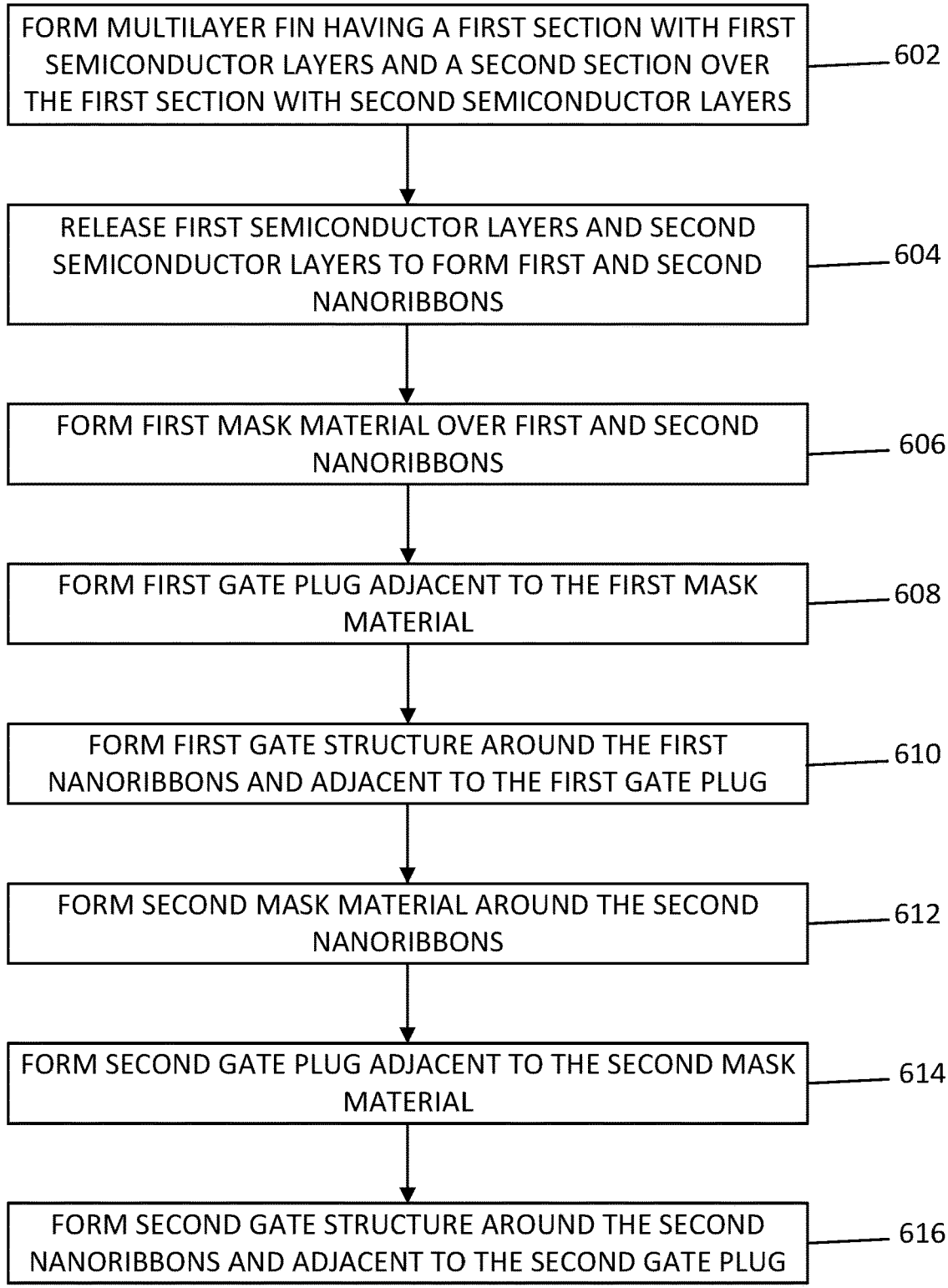
FIG. 6 is a flowchart of a fabrication process for stacked semiconductor devices having a shared gate structure that is T-shaped, in accordance with an embodiment of the present disclosure.

FIG. 6 is a flow chart of a method 600 for forming at least a portion of an integrated circuit, according to an embodiment. Various operations of method 600 may be illustrated in FIGS. 2A-2D and 3A-3F. However, the correlation of the various operations of method 600 to the specific components illustrated in the aforementioned figures is not intended to imply any structural and/or use limitations. Rather, the aforementioned figures provide one example embodiment of method 600. Other operations may be performed before, during, or after any of the operations of method 600. Some of the operations of method 600 may be performed in a different order than the illustrated order.

Method 600 begins with operation 602 where a multilayer fin is formed having a first section with alternating sacrificial and first semiconductor layers and a second section with alternating sacrificial and second semiconductor layers. The sacrificial layers may include SiGe while the first and second semiconductor layers may be Si, SiGe, Ge, InP, or GaAs, to name a few examples. The multilayer fin may be formed over a substrate. The thickness of each of the sacrificial and semiconductor layers may be between about 5 nm and about 20 nm or between about 5 nm and about 10 nm. In some embodiments, the first semiconductor layers of the first fin section include a different material compared to the second semiconductor layers of the third fin section. For example, the first fin section may have first semiconductor layers that are Si having p-type dopants and the second fin section may have second semiconductor layers that are Si having n-type dopants. Each of the sacrificial and semiconductor layers may be deposited using any known material deposition technique, such as CVD, PECVD, PVD, or ALD. In some embodiments, the first fin section is separated from the second fin section by a third section, which includes a sacrificial layer that is thicker than the other sacrificial layers of the multilayer fin.

According to some embodiments, once the material layers have been deposited, the multilayer fin may be defined via an anisotropic etching process, such as RIE, using a patterned mask material to protect the fin from the etch. The fin height may include the alternating material layers of each of the two or three sections and a subfin portion formed from the substrate material. In some other embodiments, trenches are first formed in a dielectric material and the alternating material layers of the fin are formed within the trenches. Individual fins may be further defined by patterning a sacrificial gate and spacer structures, then etching around the sacrificial gate and spacer structures via an anisotropic etching process, such as RIE.

Method 600 continues with operation 604 where the sacrificial layers are removed thus releasing the first and second semiconductor layers to form nanoribbons. Any wet or dry isotropic etching process may be used to remove the sacrificial layers while not removing (or removing very little of) the first and second semiconductor layers. At this point, the released first semiconductor layers form first nanoribbons of a first semiconductor device that extend between a first source region and a first drain region, and the released second semiconductor layers form second nanoribbons of a second semiconductor device that extend between a second source region and a second drain region. The second nanoribbons are spaced vertically above the first nanoribbons as they were formed from the same multilayer fin.

Method 600 continues with operation 606 where a first mask material is formed over the first and second nanoribbons. The first mask material may be any suitable hard mask or photoresist material, such as a carbon hard mask (CHM). According to some embodiments, the first mask material is patterned such that it remains over both first and second nanoribbons but includes openings on either side of first and second nanoribbons. In some embodiments, the first mask material extends laterally about the same distance from either ends of the first and second nanoribbons.

Method 600 continues with operation 608 where at least a first gate plug is formed adjacent to the first mask material. Gate plugs may be formed on either side of first mask material. The first gate plug may be formed from any suitable dielectric material, such as silicon nitride. The first gate plug may be first deposited into an opening through the first mask material and then recessed back using an isotropic etching process. In some examples, the first gate plug is recessed to a final height that is above a top-most nanoribbon from the first nanoribbons and below a bottom-most nanoribbon from the second nanoribbons.

Method 600 continues with operation 610 where a first gate structure is formed around the first nanoribbons and adjacent to the first gate plug. The first gate structure includes a first gate dielectric and a first gate electrode over the first gate dielectric. The first gate dielectric may be conformally formed over the first nanoribbons and may include any number of dielectric layers. The first gate electrode may be formed over the first gate dielectric and recessed to a height that is about the same as, or less than, a height of the first gate plug. The first gate electrode may be any standard or proprietary gate structure that includes any number of conductive layers. The first gate electrode may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. According to some embodiments, the first gate structure has a total width between about 30 nm and about 50 nm.

Method 600 continues with operation 612 where a second mask material is formed around the second nanoribbons. The second mask material may be any suitable hard mask or photoresist material, such as a carbon hard mask (CHM). According to some embodiments, the second mask material is patterned such that it protects the second nanoribbons and has a width that is greater than the width of the first gate structure.

Method 600 continues with operation 614 where at least one second gate plug is formed adjacent to the second mask material. Gate plugs may be formed on either side of the second mask material. The second gate plug may be formed from any suitable dielectric material, such as silicon nitride. In some embodiments, the second gate plug is formed directly on a portion of the first gate plug. The second gate plug may have a smaller width compared to the first gate plug. According to some embodiments, an entirety of the second gate plug is formed on a portion of the first gate plug.

Method 600 continues with operation 616 where a second gate structure is formed around the second nanoribbons and adjacent to the second gate plug. The second gate structure includes a second gate dielectric and a second gate electrode over the second gate dielectric. The second gate dielectric may be conformally formed over the second nanoribbons and may include any number of dielectric layers. In some examples, the second gate dielectric is formed at the same time as the first gate dielectric and thus includes the same material. In other examples, any portion of the first gate dielectric is removed from around the second nanoribbons before forming the second gate dielectric, which may include different material compared to the first gate dielectric. The second gate electrode may be formed over the second gate dielectric and may be any standard or proprietary gate structure that includes any number of conductive layers. The second gate electrode may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. In some embodiments, the first gate electrode includes n-type work-function materials and the second gate electrode includes p-type work-function materials or vice versa. The second gate structure is wider than the first gate structure, according to some embodiments. For example, the second gate structure may be at least twice as wide as the first gate structure. A width of the second gate structure may be between about 50 nm and about 80 nm.

Figure 7:
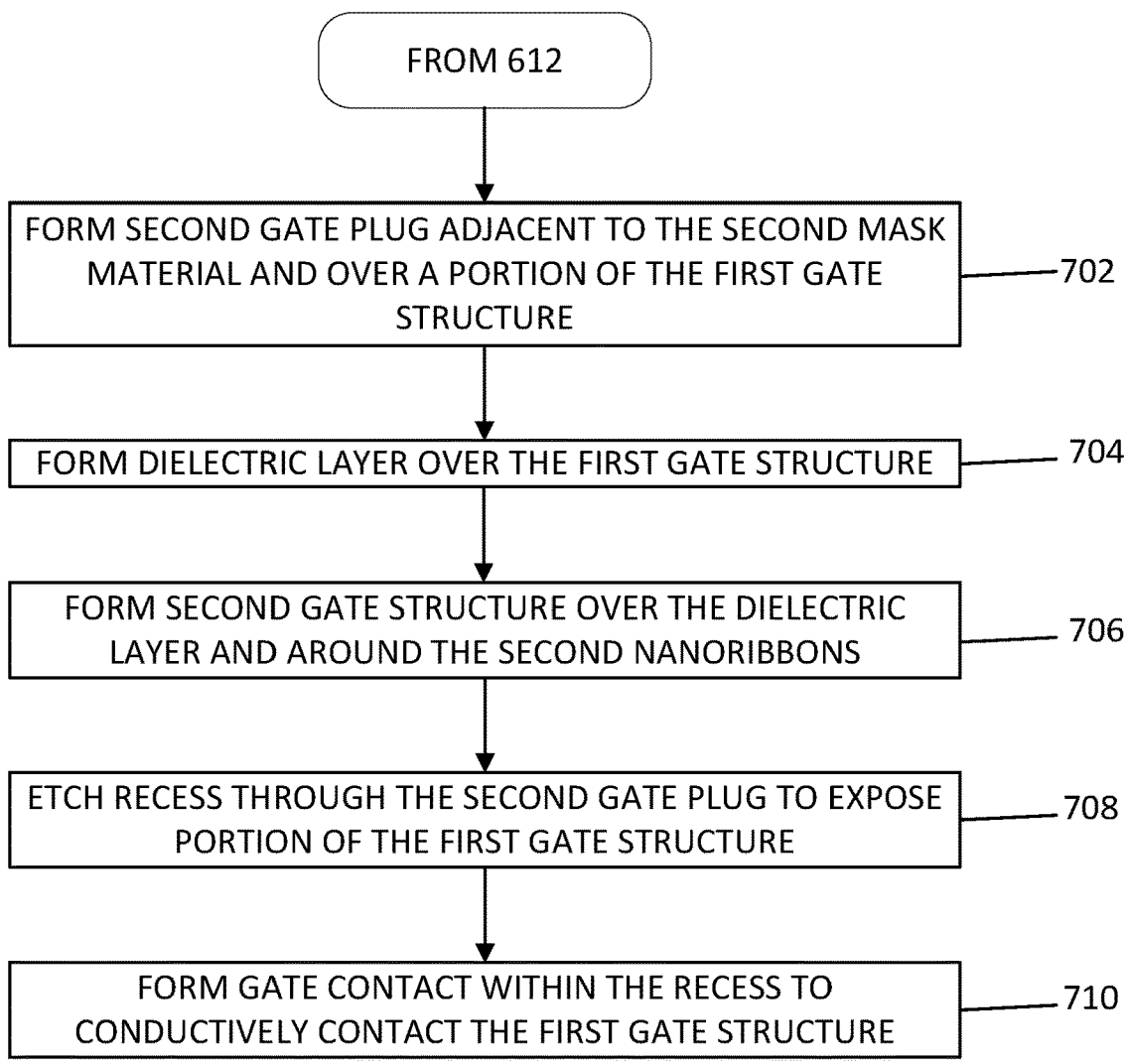
FIG. 7 is a flowchart of a fabrication process for stacked semiconductor devices having a split gate structure and a contact that lands on the bottom gate of the split gat structure, in accordance with an embodiment of the present disclosure.

FIG. 7 is a flow chart of another method 700 for forming at least a portion of an integrated circuit, according to an embodiment. Various operations of method 700 may be illustrated in FIGS. 4A-4H. However, the correlation of the various operations of method 700 to the specific components illustrated in the aforementioned figures is not intended to imply any structural and/or use limitations. Rather, the aforementioned figures provide one example embodiment of method 700. Other operations may be performed before, during, or after any of the operations of method 700. Some of the operations of method 700 may be performed in a different order than the illustrated order.

Method 700 includes the same operations 602-612 from method 600, and thus takes continues after operation 612 from method 600, according to some embodiments. However, the dimensions of the first gate structure may be different than that described above. For example, in method 700, the first gate structure may extend further to one side of the first nanoribbons compared to the opposite side of the first nanoribbons.

At operation 702, a second gate plug is formed adjacent to the second mask material and over at least a portion of the first gate structure. Gate plugs may be formed on either side of the second mask material. The second gate plug may be formed from any suitable dielectric material, such as silicon nitride. In some embodiments, the second gate plug is formed directly on a portion of the first gate plug and directly on a portion of the first gate structure.

Method 700 continues with operation 704 where a dielectric layer is formed over the first gate structure and adjacent to the second gate plug. The dielectric layer may be deposited in the gate trench around the second nanoribbons and recessed to a final thickness such that the dielectric layer is between a top-most nanoribbon of the first nanoribbons and a bottom-most nanoribbon of the second nanoribbons. The dielectric layer may have a thickness between about 15 nm and about 40 nm. The dielectric layer 420 may be any suitable dielectric material such as silicon dioxide, aluminum oxide, or silicon oxycarbonitride. It should be noted that the timing of the formation of the dielectric layer may be different such that, in some embodiments, the dielectric layer is formed before the second gate plug is formed. In this way, the second gate plug may be formed over a portion of the first gate structure but directly on the dielectric layer.

Method 700 continues with operation 706 where a second gate structure is formed over the dielectric layer and around the second nanoribbons. The second gate structure includes a second gate dielectric and a second gate electrode over the second gate dielectric. The second gate dielectric may be conformally formed over the second nanoribbons and may include any number of dielectric layers. In some examples, the second gate dielectric is formed at the same time as the first gate dielectric and thus includes the same material. In other examples, any portion of the first gate dielectric is removed from around the second nanoribbons before forming the second gate dielectric, which may include different material compared to the first gate dielectric. The second gate electrode may be formed over the second gate dielectric and may be any standard or proprietary gate structure that includes any number of conductive layers. The second gate electrode may include, for instance, one or more work-function layers, resistance-reducing layers, and/or barrier layers. The work-function layers can include, for example, p-type work-function materials (e.g., titanium nitride) for PMOS gates, or n-type work-function materials (e.g., titanium aluminum carbide) for NMOS gates. In some embodiments, the first gate electrode includes n-type work-function materials and the second gate electrode includes p-type work-function materials or vice versa. According to some embodiments, the second gate electrode has a smaller width compared to the first gate electrode.

Method 700 continues with operation 708 where a trench recess is etched through the second gate plug to expose a portion of the first gate structure. An anisotropic etching process, such as RIE, may be used to form the trench recess through the second gate plug until at least a portion of the underlying first gate electrode is exposed. According to some embodiments, the trench recess is flanked on either side by portions of the second gate plug. The trench recess may extend longer in a Y-direction compared to an X-direction while the first gate structure extends longer in the X-direction compared to the Y-direction.

Method 700 continues with operation 710 where a gate contact is formed within the trench recess. The gate contact conductively contacts a portion of the first gate structure. The gate contact may be any suitably conductive material, such as any metal. In some examples, the gate contact includes tungsten, copper, titanium, ruthenium, cobalt, or any alloys thereof. The gate contact has a width in the X-direction that is sufficiently small enough to ensure that the gate contact is within a total width of the second gate plug. According to some embodiments, the gate contact includes a length in the Y-direction that is larger than its width. The length of the gate contact may be at least twice as long, or at least three times as long as its width. In some examples, the gate contact has a width between about 10 nm and about 20 nm and a length between about 20 nm and about 60 nm.

Example System

Figure 8:
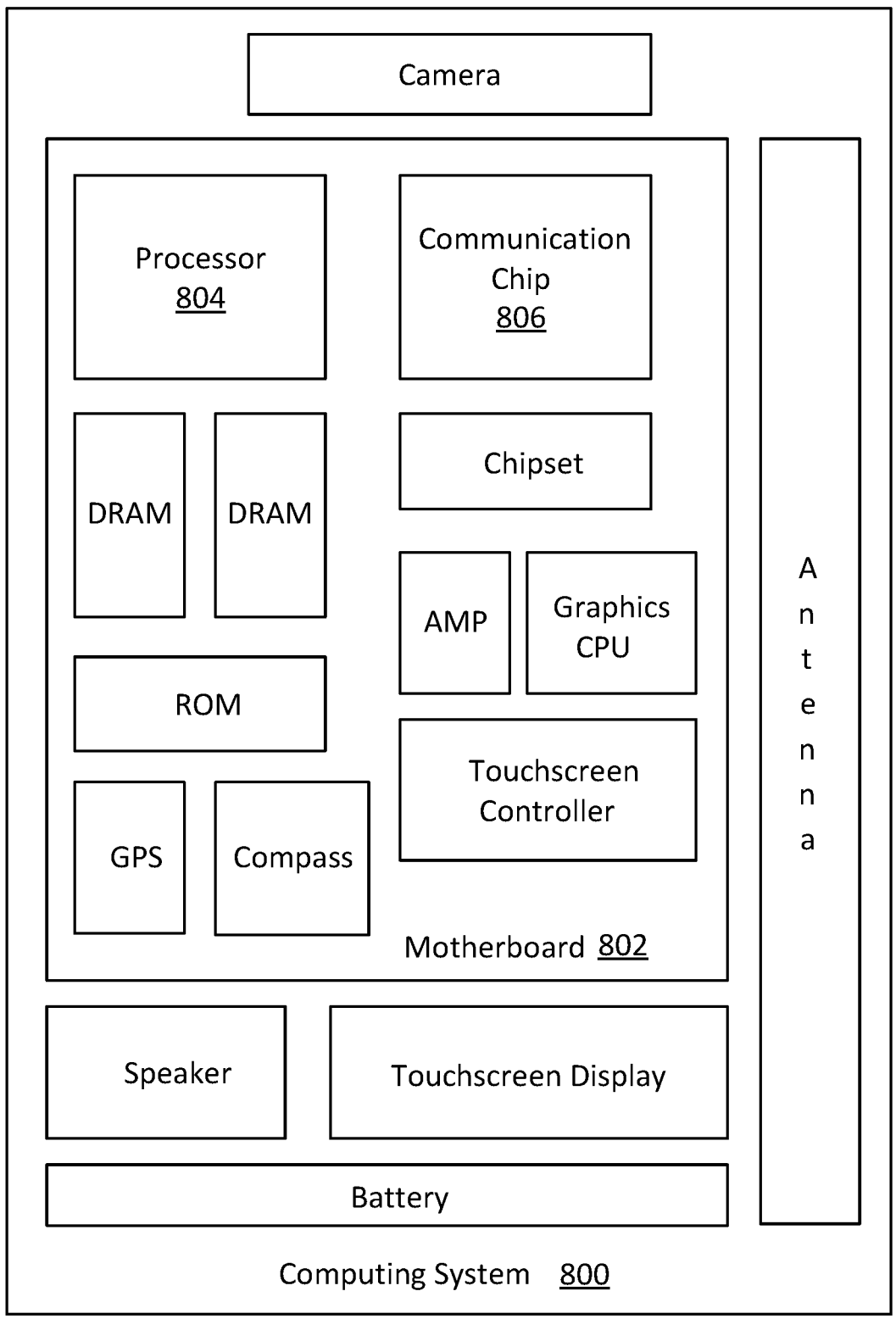
FIG. 8 illustrates a computing system including one or more integrated circuits, as variously described herein, in accordance with an embodiment of the present disclosure.

FIG. 8 is an example computing system implemented with one or more of the integrated circuit structures as disclosed herein, in accordance with some embodiments of the present disclosure. As can be seen, the computing system 800 houses a motherboard 802. The motherboard 802 may include a number of components, including, but not limited to, a processor 804 and at least one communication chip 806, each of which can be physically and electrically coupled to the motherboard 802, or otherwise integrated therein. As will be appreciated, the motherboard 802 may be, for example, any printed circuit board (PCB), whether a main board, a daughterboard mounted on a main board, or the only board of system 800, etc.

Depending on its applications, computing system 800 may include one or more other components that may or may not be physically and electrically coupled to the motherboard 802. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 800 may include one or more integrated circuit structures or devices configured in accordance with an example embodiment (e.g., a module including an integrated circuit device on a substrate, the substrate having a stacked configuration of semiconductor devices with asymmetric gates or elongated gate contacts, as variously provided herein). In some embodiments, multiple functions can be integrated into one or more chips (e.g., for instance, note that the communication chip 806 can be part of or otherwise integrated into the processor 804).

The communication chip 806 enables wireless communications for the transfer of data to and from the computing system 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing system 800 includes an integrated circuit die packaged within the processor 804. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 806 also may include an integrated circuit die packaged within the communication chip 806. In accordance with some such example embodiments, the integrated circuit die of the communication chip includes one or more semiconductor devices as variously described herein. As will be appreciated in light of this disclosure, note that multi-standard wireless capability may be integrated directly into the processor 804 (e.g., where functionality of any chips 806 is integrated into processor 804, rather than having separate communication chips). Further note that processor 804 may be a chip set having such wireless capability. In short, any number of processor 804 and/or communication chips 806 can be used. Likewise, any one chip or chip set can have multiple functions integrated therein.

In various implementations, the computing system 800 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 800 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a first semiconductor device having first one or more semiconductor bodies extending in a first direction between a first source region and a first drain region and a second semiconductor device having second one or more semiconductor bodies extending in the first direction between a second source region and a second drain region. The first one or more semiconductor bodies are spaced vertically from the second one or more semiconductor bodies in a second direction different from the first direction. The integrated circuit also includes a first gate structure around the first one or more semiconductor bodies and having a first width in a third direction different from the first and second directions between a first gate plug and a second gate plug, and a second gate structure around the second one or more semiconductor bodies and having a second width in the third direction between a third gate plug and a fourth gate plug. Each of the first, second, third, and fourth gate plugs include a body of dielectric material. The second gate structure directly contacts the first gate structure in a same gate trench. The first width is at least 5 nanometers greater than the second width.

Example 2 includes the subject matter of Example 1, wherein the first one or more semiconductor bodies and the second one or more semiconductor bodies comprise germanium, silicon, or silicon and germanium.

Example 3 includes the subject matter of Example 1 or 2, wherein a vertical distance between the first one or more semiconductor bodies and the second one or more semiconductor bodies is between about 15 nm and about 100 nm.

Example 4 includes the subject matter of any one of Examples 1-3, wherein the first width is between about 50 nm and about 100 nm and the second width is between about 20 nm and about 50 nm.

Example 5 includes the subject matter of any one of Examples 1-4, wherein each of the first, second, third, and fourth gate plugs have substantially the same material composition.

Example 6 includes the subject matter of Example 5, wherein each of the first, second, third, and fourth gate plugs comprise silicon and nitrogen, silicon and oxygen, or silicon and carbon.

Example 7 includes the subject matter of any one of Examples 1-6, wherein the first and second gate plugs have a smaller width in the third direction than the third and fourth gate plugs.

Example 8 includes the subject matter of any one of Examples 1-7, wherein the first direction is orthogonal to the second direction, and the third direction is orthogonal to both the first and second directions.

Example 9 is a printed circuit board comprising the integrated circuit of any one of Examples 1-8.

Example 10 is an electronic device that includes a chip package comprising one or more dies. At least one of the one or more dies includes a first semiconductor device having first one or more semiconductor nanoribbons extending in a first direction between a first source region and a first drain region and a second semiconductor device having second one or more semiconductor nanoribbons extending in the first direction between a second source region and a second drain region. The first one or more semiconductor nanoribbons are spaced vertically from the second one or more semiconductor nanoribbons in a second direction different from the first direction. The integrated circuit also includes a first gate structure around the first one or more semiconductor nanoribbons and having a first width in a third direction different from the first and second directions between a first gate plug and a second gate plug, and a second gate structure around the second one or more semiconductor nanoribbons and having a second width in the third direction between a third gate plug and a fourth gate plug. The second gate structure directly contacts the first gate structure in a same gate trench. The first width is at least 5 nanometers greater than the second width.

Example 11 includes the subject matter of Example 10, wherein the first one or more semiconductor nanoribbons and the second one or more semiconductor nanoribbons comprise germanium, silicon, or any combination thereof.

Example 12 includes the subject matter of Example 10 or 11, wherein a vertical distance between the first one or more semiconductor nanoribbons and the second one or more semiconductor nanoribbons is between about 15 nm and about 100 nm.

Example 13 includes the subject matter of any one of Examples 10-12, wherein the first width is between about 50 nm and about 80 nm and the second width is between about 30 nm and about 50 nm.

Example 14 includes the subject matter of any one of Examples 10-13, wherein each of the first, second, third, and fourth gate plugs have substantially the same material composition.

Example 15 includes the subject matter of Example 14, wherein each of the first, second, third, and fourth gate plugs comprise silicon and nitrogen.

Example 16 includes the subject matter of any one of Examples 10-15, wherein the first and second gate plugs have a smaller width in the third direction than the third and fourth gate plugs.

Example 17 includes the subject matter of any one of Examples 10-16, wherein the first direction is orthogonal to the second direction, and the third direction is orthogonal to both the first and second directions.

Example 18 includes the subject matter of any one of Examples 10-17, further comprising a printed circuit board, wherein the chip package is attached to the printed circuit board.

Example 19 is an integrated circuit that includes a first semiconductor device having first one or more semiconductor nanoribbons extending in a first direction between a first source region and a first drain region and a second semiconductor device having second one or more semiconductor nanoribbons extending in the first direction between a second source region and a second drain region. The first one or more semiconductor nanoribbons are spaced vertically from the second one or more semiconductor nanoribbons in a second direction different from the first direction. The integrated circuit also includes a first gate structure around the first one or more semiconductor nanoribbons and having a first width in a third direction different from the first and second directions between a first gate plug and a second gate plug, a dielectric layer over the first gate structure, and a second gate structure over the dielectric layer and around the second one or more semiconductor nanoribbons. The second gate structure has a second width different from the first width in the third direction between a third gate plug and a fourth gate plug. The integrated circuit also includes a gate contact extending through the fourth gate plug and contacting a portion of the first gate structure. A length of the gate contact in the first direction is greater than a length of the first gate structure in the first direction.

Example 20 includes the subject matter of Example 19, wherein the first one or more semiconductor nanoribbons and the second one or more semiconductor nanoribbons comprise germanium, silicon, or any combination thereof.

Example 21 includes the subject matter of Example 19 or 20, wherein a vertical distance between the first one or more semiconductor nanoribbons and the second one or more semiconductor nanoribbons is between about 15 nm and about 100 nm.

Example 22 includes the subject matter of any one of Examples 19-21, wherein the first gate structure extends beneath at least a portion of the fourth gate plug.

Example 23 includes the subject matter of any one of Examples 19-22, wherein each of the first, second, third, and fourth gate plugs have substantially the same material composition.

Example 24 includes the subject matter of Example 23, wherein each of the first, second, third, and fourth gate plugs comprise silicon and nitrogen.

Example 25 includes the subject matter of any one of Examples 19-24, wherein the length of the gate contact is at least twice as long as the width of the gate contact.

Example 26 includes the subject matter of any one of Examples 19-25, wherein the length of the gate contact is between about 20 nm and about 60 nm.

Example 27 includes the subject matter of any one of Examples 19-26, wherein the first direction is orthogonal to the second direction, and the third direction is orthogonal to both the first and second directions.

Example 28 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel, the multilayer fin extending lengthwise in a first direction; removing the first material layers and the third layers to form suspended first one or more nanoribbons from the second material layers and suspended second one or more nanoribbons from the fourth material layers; forming a first mask material around the first one or more nanoribbons and the second one or more nanoribbons; forming a first gate plug adjacent to the first mask material, wherein a top surface of the gate plug is above a topmost nanoribbon of the first one or more nanoribbons and below a bottommost nanoribbon of the second one or more nanoribbons; removing the first mask material and forming a first gate structure around the first one or more nanoribbons; forming a second mask material around the second one or more nanoribbons; forming a second gate plug adjacent to the second mask material, the second gate plug being over the first gate plug; and removing the second mask material and forming a second gate structure around the second one or more nanoribbons, wherein the second gate structure has a greater width in a second direction orthogonal to the first direction compared to a width of the first gate structure in the second direction.

Example 29 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel, the multilayer fin extending lengthwise in a first direction; removing the first material layers and the third layers to form suspended first one or more nanoribbons from the second material layers and suspended second one or more nanoribbons from the fourth material layers; forming a first mask material around the first one or more nanoribbons and the second one or more nanoribbons; forming a first gate plug adjacent to the first mask material, wherein a top surface of the gate plug is above a topmost nanoribbon of the first one or more nanoribbons and below a bottommost nanoribbon of the second one or more nanoribbons; removing the first mask material and forming a first gate structure around the first one or more nanoribbons; forming a second mask material around the second one or more nanoribbons; forming a second gate plug adjacent to the second mask material, the second gate plug being over the first gate plug; removing the second mask material and forming a dielectric layer over the first gate structure; forming a second gate structure over the dielectric layer and around the second one or more nanoribbons; etching a recess through the second gate plug, the recess exposing a portion of the first gate structure; and forming a gate contact within the recess, the gate contact conductively coupled to the first gate structure, wherein a length of the gate contact in the first direction is greater than a length of the first gate structure in the first direction.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a first semiconductor device having first one or more semiconductor bodies extending in a first direction between a first source region and a first drain region;
   a second semiconductor device having second one or more semiconductor bodies extending in the first direction between a second source region and a second drain region, the first one or more semiconductor bodies spaced vertically from the second one or more semiconductor bodies in a second direction different from the first direction;
   a first gate structure around the first one or more semiconductor bodies and having a first width in a third direction different from the first and second directions between a first gate plug and a second gate plug, the first and second gate plugs each comprising a body of dielectric material; and
   a second gate structure around the second one or more semiconductor bodies and having a second width in the third direction between a third gate plug and a fourth gate plug, the third and fourth gate plugs each comprising a body of dielectric material, wherein the first width is at least 5 nanometers greater than the second width, wherein the second gate structure directly contacts the first gate structure in a same gate trench.

2. The integrated circuit of claim 1, wherein the first width is between about 50 nm and about 100 nm and the second width is between about 20 nm and about 50 nm.

3. The integrated circuit of claim 1, wherein each of the first, second, third, and fourth gate plugs have substantially the same material composition.

4. The integrated circuit of claim 1, wherein the first and second gate plugs have a smaller width in the third direction than the third and fourth gate plugs.

5. The integrated circuit of claim 1, wherein the first direction is orthogonal to the second direction, and the third direction is orthogonal to both the first and second directions.

6. A printed circuit board comprising the integrated circuit of claim 1.

7. An electronic device, comprising:
a chip package comprising one or more dies, at least one of the one or more dies comprising
a first semiconductor device having first one or more semiconductor nanoribbons extending in a first direction between a first source region and a first drain region;
a second semiconductor device having second one or more semiconductor nanoribbons extending in the first direction between a second source region and a second drain region, the first one or more semiconductor nanoribbons spaced vertically from the second one or more semiconductor nanoribbons in a second direction different from the first direction;
a first gate structure around the first one or more semiconductor nanoribbons and having a first width in a third direction different from the first and second directions between a first gate plug and a second gate plug; and
a second gate structure around the second one or more semiconductor nanoribbons and having a second width in the third direction between a third gate plug and a fourth gate plug, wherein the first width is at least 5 nanometers greater than the second width, wherein the second gate structure directly contacts the first gate structure in a same gate trench.

8. The electronic device of claim 7, wherein the first width is between about 50 nm and about 80 nm and the second width is between about 30 nm and about 50 nm.

9. The electronic device of claim 7, wherein each of the first, second, third, and fourth gate plugs have substantially the same material composition.

10. The electronic device of claim 9, wherein each of the first, second, third, and fourth gate plugs comprise silicon and nitrogen, silicon and oxygen, or silicon and carbon.

11. The electronic device of claim 7, wherein the first and second gate plugs have a smaller width in the third direction than the third and fourth gate plugs.

12. The electronic device of claim 7, wherein the first direction is orthogonal to the second direction, and the third direction is orthogonal to both the first and second directions.

13. The electronic device of claim 7, further comprising a printed circuit board, wherein the chip package is attached to the printed circuit board.

14. An integrated circuit comprising:
a first semiconductor device having first one or more semiconductor nanoribbons extending in a first direction between a first source region and a first drain region;
a second semiconductor device having second one or more semiconductor nanoribbons extending in the first direction between a second source region and a second drain region, the first one or more semiconductor nanoribbons spaced vertically from the second one or more semiconductor nanoribbons in a second direction different from the first direction;
a first gate structure around the first one or more semiconductor nanoribbons and having a first width in a third direction different from the first and second directions between a first gate plug and a second gate plug;
a dielectric layer over the first gate structure;
a second gate structure over the dielectric layer and around the second one or more semiconductor nanoribbons, the second gate structure having a second width different from the first width in the third direction between a third gate plug and a fourth gate plug; and
a gate contact extending through the fourth gate plug and contacting a portion of the first gate structure, wherein a length of the gate contact in the first direction is greater than a length of the first gate structure in the first direction.

15. The integrated circuit of claim 14, wherein a vertical distance between the first one or more semiconductor nanoribbons and the second one or more semiconductor nanoribbons is between about 15 nm and about 100 nm.

16. The integrated circuit of claim 14, wherein the first gate structure extends beneath at least a portion of the fourth gate plug.

17. The integrated circuit of claim 14, wherein each of the first, second, third, and fourth gate plugs comprise silicon and nitrogen, silicon and oxygen, or silicon and carbon.

18. The integrated circuit of claim 14, wherein the length of the gate contact is at least twice as long as the width of the gate contact.

19. The integrated circuit of claim 14, wherein the length of the gate contact is between about 20 nm and about 60 nm.

20. The integrated circuit of claim 14, wherein the first direction is orthogonal to the second direction, and the third direction is orthogonal to both the first and second directions.

* * * * *